US006924755B1

(12) United States Patent
Callanan et al.

(10) Patent No.: US 6,924,755 B1
(45) Date of Patent: Aug. 2, 2005

(54) MULTI-CHANNEL ANALOG TO DIGITAL CONVERTER WHICH FACILITATES CALIBRATION OF THE ANALOG TO DIGITAL CONVERTER AND RESPECTIVE INPUT CHANNELS TO THE ANALOG TO DIGITAL CONVERTER, AND A METHOD FOR CALIBRATING THE ANALOG TO DIGITAL CONVERTER

(75) Inventors: Andreas Callanan, Murroe (IE); Thomas J. Meany, Bruff (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/307,663

(22) Filed: Dec. 2, 2002

(51) Int. Cl.[7] .................................................. H03M 1/06
(52) U.S. Cl. ........................ 341/118; 341/120; 341/155
(58) Field of Search ................................. 341/118, 120, 341/155

(56) References Cited

U.S. PATENT DOCUMENTS 5,598,157 A    1/1997   Kornblum et al.
5,617,090 A * 4/1997   Ma et al. .................... 341/118
5,638,071 A * 6/1997   Capofreddi et al. ........ 341/118

* cited by examiner

Primary Examiner—Michael Tokar
Assistant Examiner—Lam T. Mai
(74) Attorney, Agent, or Firm—Wolf, Greenfield & Sacks P.C.

(57) ABSTRACT

A multi-channel analog to digital converter which facilitates calibration of the analog to digital converter and respective input channels to the analog to digital converter, and a method for calibrating the analog to digital converter. A multi-channel ADC (1) comprising an ADC circuit (2) for converting analog signals received on input channels CH1 to CHN to digital output signals comprises a primary offset storing register (24) and a primary gain storing register (25) for storing respective primary offset and gain correction codes which are applied to the digital output signals in a primary correcting circuit (14) for correcting for the offset and gain errors introduced by the ADC circuit (2). A plurality of secondary offset storing registers (33) and a plurality of secondary gain storing registers (34) store respective secondary offset and gain correction codes which are applied to the digital output signals in a secondary correcting circuit (18) for correcting for offset and gain errors introduced by corresponding ones of the input channels CH1 to CHN.

52 Claims, 8 Drawing Sheets

US 6,924,755 B1

MULTI-CHANNEL ANALOG TO DIGITAL CONVERTER WHICH FACILITATES CALIBRATION OF THE ANALOG TO DIGITAL CONVERTER AND RESPECTIVE INPUT CHANNELS TO THE ANALOG TO DIGITAL CONVERTER, AND A METHOD FOR CALIBRATING THE ANALOG TO DIGITAL CONVERTER

FIELD OF THE INVENTION

The present invention relates to a multi-channel analog to digital converter (ADC) which facilitates calibration of an ADC circuit of the ADC as well as calibration of respective input channels to the ADC. The invention also relates to a multi-channel analog to digital converter which facilitates correction of digital output signals for errors introduced by the ADC and by some or all of the analog input channels to the ADC. The invention also relates to a multi-channel or a single channel ADC which facilitates correction of digital output signals for errors introduced by an ADC circuit of the ADC, and/or errors introduced by input channels to the ADC. The invention also relates to a method for calibrating the ADCs, and for correcting digital output signals for errors introduced by the ADC and/or analog input channels to the ADC.

BACKGROUND TO THE INVENTION

Offset and gain errors introduced during conversions of an analog signal to a digital signal by an ADC are corrected for by calibration of the ADC. On multi-channel converters which share a single ADC circuit, a single calibration coefficient storing circuit may be provided for storing calibration codes for calibrating the ADC circuit only to correct for offset and gain errors introduced by the ADC circuit. Alternatively, a calibration coefficient storing circuit may be provided for storing respective calibration codes for simultaneously correcting for errors introduced by the ADC circuit and corresponding ones of the respective input channels. In the latter case the calibration code for each channel comprises an offset correction code for correcting for offset errors introduced by both the ADC circuit and the corresponding input channel, and a gain correction code for correcting for gain errors introduced by both the ADC circuit and the corresponding channel. Such ADCs suffer from a number of disadvantages. Where only a single calibration coefficient storing circuit is provided for storing an offset and gain calibration code for correcting for the ADC circuit only, no correction can be made in the ADC for offset and gain errors introduced by the respective input channels. Where the calibration coefficient storing circuit is provided for storing a plurality of offset and gain calibration codes for correcting for offset and gain errors introduced by the combination of the ADC circuit and the respective corresponding input channels, while both ADC circuit and channel introduced offset and gain errors may be corrected for, they must be corrected for simultaneously. This presents a problem, in that unless the input channels are on-chip channels, factory calibration is of little use, since if calibration for off-chip channels is to be carried out, this will have to be carried out on-site, and any factory calibration codes relating to the ADC circuit and the channels will have to be overwritten when calibration for off-chip channels is being carried out. This is undesirable, since the integrity of an accurate factory calibration can be lost as a result of stored accurate factory calibration codes being overwritten when off-chip channel calibration is being carried out by a user. Additionally, such calibration coefficient storing circuits do not permit manual entry of calibration codes without loss of the integrity of an accurate factory calibration.

There is therefore a need for a multi-channel ADC which overcomes these problems. There is also a need for a method for calibrating a multi-channel ADC which also overcomes these problems. There is also a need for an ADC, multi-channel or single channel and a method for correcting digital output signals for errors introduced by an ADC circuit of the ADC and/or errors introduced by one or more of the analog input channels to the ADC.

The present invention is directed towards providing such a multi-channel ADC and a method for calibrating the ADC. The invention is also directed towards providing an ADC, multi-channel or single channel which facilitates correcting for errors in the digital output signal introduced by an ADC circuit in the ADC and/or one or more of the analog input channels. The invention is also directed towards providing a method for correcting for such errors in digital output signals of an ADC.

SUMMARY OF THE INVENTION

According to the invention there is provided a multi-channel analog to digital converter (ADC) comprising:

an ADC circuit for sequentially converting analog input signals received from a plurality of input channels to digital output signals, a primary storing circuit for storing a primary calibration coefficient for correcting the digital output signals for errors introduced by the ADC circuit, a secondary storing circuit for storing secondary calibration coefficients corresponding to respective ones of the input channels for correcting the digital output signals for errors introduced by the respective corresponding input channels.

In one embodiment of the invention, a correcting circuit is provided for selectively applying to at least some of the digital output signals, at least one of the primary calibration coefficient and the corresponding secondary calibration coefficient.

In another embodiment of the invention a primary calibration coefficient determining circuit is provided for determining the primary calibration coefficient for writing to the primary storing circuit, and a secondary calibration coefficient determining circuit is provided for determining the secondary calibration coefficients for the respective input channels for writing to the secondary storing circuit.

In a further embodiment of the invention the correcting circuit comprises a primary correcting circuit for applying the primary calibration coefficient stored in the primary storing circuit to the at least some of the digital output signals for correcting the digital output signals with the primary calibration coefficient, and a secondary correcting circuit for selectively applying corresponding ones of the secondary calibration coefficients stored in the secondary storing circuit to the corresponding digital output signals for correcting the at least some of the digital output signals.

Preferably, the primary and secondary correcting circuits are arranged relative to the ADC circuit for applying the primary calibration coefficient to the digital output signals prior to the corresponding secondary calibration coefficients being applied to the respective corresponding digital output signals.

Advantageously, the primary storing circuit comprises a primary offset register for storing a primary offset correction code for correcting for offset errors introduced by the ADC circuit, and a primary gain register for storing a primary gain correction code for correcting for gain errors introduced by the ADC circuit.

Ideally, the primary calibration coefficient determining circuit comprises a primary offset code determining circuit for determining the primary offset correction code for storing in the primary offset register, and a primary gain code determining circuit for determining the primary gain correction code for storing in the primary gain register.

In one embodiment of the invention the secondary storing circuit comprises a plurality of secondary offset registers for storing respective secondary offset correction codes corresponding to respective ones of the input channels for correcting for offset errors introduced by the respective corresponding input channels, and a plurality of secondary gain registers for storing respective secondary gain correction codes corresponding to respective ones of the input channels for correcting for gain errors introduced by the respective corresponding input channels.

Preferably, the secondary calibration coefficient determining circuit comprises a secondary offset code determining circuit for determining the secondary offset correction codes for the respective input channels for storing in the corresponding secondary offset registers, and a secondary gain code determining circuit for determining the secondary gain correction codes for the respective input channels for storing in the corresponding secondary gain registers.

In one embodiment of the invention the secondary offset code determining circuit is operable for determining the secondary offset correction codes for correcting for offset errors introduced by the respective input channels.

In another embodiment of the invention the secondary offset code determining circuit is operable for determining the secondary offset correction codes for correcting for combined offset errors introduced by the respective input channels and the ADC circuit.

In a further embodiment of the invention the secondary gain code determining circuit is operable for determining the secondary gain correction codes for correcting for gain errors introduced by the respective input channels.

In a still further embodiment of the invention the secondary gain code determining circuit is operable for determining the secondary gain correction codes for correcting for combined gain errors introduced by the respective input channels and the ADC circuit.

In one embodiment of the invention the primary correcting circuit comprises a primary adder element for applying the primary offset correction code stored in the primary offset register to the digital output signals, and a primary multiplying element for applying the primary gain correction code stored in the primary gain register to the digital output signals.

In another embodiment of the invention the primary adder element and the primary multiplying element are arranged so that the primary offset correction code is applied to the respective digital output signals before the primary gain correction code is applied to the digital output signals.

In a further embodiment of the invention the secondary correcting circuit comprises a secondary adder element for applying the secondary offset correction codes stored in the secondary offset registers to the corresponding ones of the digital output signals, and a secondary multiplying element for applying the secondary gain correction codes stored in the secondary gain registers to the corresponding ones of the digital output signals.

In a still further embodiment of the invention the secondary adder element and the secondary multiplying element are arranged so that the corresponding secondary offset correction code is applied to the corresponding digital output signal before the corresponding secondary gain correction code is applied to the digital output signal.

In one embodiment of the invention a bypass circuit is provided so that one or both of the primary correcting circuit and the secondary correcting circuit can be selectively bypassed.

In another embodiment of the invention a computation element is provided for computing combined calibration coefficients for correcting for errors introduced by the ADC circuit and respective ones of the input channels, the computation element computing the combined calibration coefficients from the primary calibration coefficient stored in the primary storing circuit, and the corresponding secondary calibration coefficients stored in the secondary storing circuit.

Preferably, the correcting circuit comprises a means for applying the combined calibration coefficients to the corresponding digital output signals.

In one embodiment of the invention each combined calibration coefficient comprises a first calibration code element to be applied to the corresponding digital output signal, and a second calibration code element to be applied to the corresponding digital output signal, and preferably, the correcting circuit comprises a first adder element for applying the first calibration code elements to the corresponding digital output signals, and a multiplying element for applying the second calibration code element to the corresponding digital output signals.

In one embodiment of the invention a combined calibration coefficient storing circuit is provided for storing the respective computed combined calibration coefficients.

In another embodiment of the invention the primary gain register comprises a first primary gain register for storing a first primary gain correction code of the primary gain correction is code for applying to the digital output signals which are of value greater than a predetermined value, and a second primary gain register for storing a second primary gain correction code of the primary gain correction code for applying to the digital output signal which are of value less than the predetermined value.

In a further embodiment of the invention each secondary gain register comprises a first secondary gain register for storing a first secondary gain correction code of the corresponding secondary gain correction code for applying to the corresponding digital output signal which is of value greater than a predetermined value, and a second secondary gain register for storing a second secondary gain correction code of the corresponding secondary gain correction code for applying to the corresponding digital output signal which is of value less than the predetermined value.

In one embodiment of the invention an interface circuit is provided for facilitating selective manual inputting of secondary offset and gain correction codes to respective selected ones of the secondary offset and gain registers.

In another embodiment of the invention the interface circuit facilitates selective manual inputting of primary offset and gain correction codes to the primary offset and gain registers.

Preferably, the interface circuit is adapted for facilitating selective manual outputting of secondary offset and gain correction codes from the secondary offset and gain registers. Advantageously, the interface circuit facilitates selective manual outputting of the primary offset and gain correction codes from the primary offset and gain registers.

In one embodiment of the invention a first calibration reference signal source is provided for applying to the ADC circuit for determining the primary calibration coefficient, and in another embodiment of the invention, the first calibration reference signal source is selectively applicable to the respective input channels for determining the corresponding secondary calibration coefficients.

In another embodiment of the invention a second high calibration reference signal source is provided for applying to the ADC circuit for determining the primary calibration coefficient, and in a further embodiment of the invention, the second high calibration reference signal source is selectively applicable to the respective input channels for determining the corresponding secondary calibration coefficients.

In a further embodiment of the invention a second low calibration reference signal source is provided for applying to the ADC circuit for determining the primary calibration coefficient, and in a still further embodiment of the invention, the second high calibration reference signal source is selectively applicable to the respective input channels for determining the corresponding secondary calibration coefficients.

In one embodiment of the invention, the ADC further comprises a plurality of input terminals for receiving the analog input signals from the input channels, a main switch network for selectively and sequentially switching the input terminals to the ADC circuit, and a control circuit for controlling the main switch network for determining the sequence in which the input terminals are to be switched to the ADC circuit.

Additionally, the invention provides an ADC comprising:
an ADC circuit for converting an analog input signal to a digital output signal,
a plurality of storing circuits for storing calibration coefficients for correcting for errors introduced by the ADC circuit,
a correcting circuit comprising a plurality of correction stages in which calibration coefficients from the storing circuits are applied to the digital output signal.

In one embodiment of the invention, the correction stages through which the digital output signal is passed are selectable.

In another embodiment of the invention, the calibration coefficients to be applied to the digital output signal are selectable.

In a further embodiment of the invention, the sequence in which the calibration coefficients are applied to the digital output signal is selectable.

Further, the invention provides a method for calibrating a multi-channel ADC comprising an ADC circuit for receiving analog input signals from a plurality of input channels, the method comprising the steps of:
determining a primary calibration coefficient for correcting digital output signals for errors introduced by the ADC circuit,
storing the primary calibration coefficient so that the primary calibration coefficient can be selectively applied to digital output signals from the ADC circuit for correcting for errors in the digital output signals introduced by the ADC circuit,
determining secondary calibration coefficients for at least some of the input channels for correcting for errors introduced by the corresponding input channels,
storing the secondary calibration coefficients so that the secondary calibration coefficients can be selectively applied to digital output signals resulting from analog input signals for correcting for errors introduced by the corresponding input channels.

Preferably, a calibration reference signal is applied to the ADC circuit for determining the primary calibration coefficient.

In one embodiment of the invention a calibration reference signal is sequentially applied to the at least some of the input channels for determining the corresponding secondary calibration coefficients.

In another embodiment of the invention the digital output signal from the ADC circuit resulting from the calibration reference signal applied to the ADC circuit is compared with an ideal value for determining the primary calibration coefficient.

Preferably, the digital output signals from the ADC circuit resulting from the calibration reference signal applied to input channels are compared with respective ideal values for determining the secondary calibration coefficients for the respective corresponding input channels.

In one embodiment of the invention the primary calibration coefficient is applied to each digital output signal from the ADC circuit resulting from the calibration reference signal applied to a corresponding one of the input channels prior to the secondary calibration coefficient being determined so that the determined secondary calibration coefficient corrects for errors introduced only by the corresponding input channel.

In another embodiment of the invention the primary and secondary calibration coefficients are stored so that each digital output signal resulting from a conversion by the ADC circuit is corrected separately by the primary calibration coefficient and the corresponding one of the secondary calibration coefficients.

In a further embodiment of the invention the method comprises the further step of computing a combined calibration coefficient corresponding to each input channel for which a secondary calibration coefficient has been determined for correcting for errors introduced by the ADC circuit and the corresponding input channel, each combined calibration coefficient being determined from the primary calibration coefficient and the corresponding secondary calibration coefficient.

In one embodiment of the invention a first high calibration reference signal is applied to the ADC circuit for determining a first primary calibration coefficient of the primary calibration coefficient for applying to the digital output signals which are of value greater than a predetermined value, and a second low calibration reference signal is applied to the ADC circuit for determining a second primary calibration coefficient of the primary calibration coefficient for applying to the digital output signals.

The invention also provides a method for correcting a digital output signal converted from an analog input signal by an ADC for errors introduced by the ADC, the method comprising the steps of:
storing a plurality of calibration coefficients for correcting for errors introduced by the ADC in storing circuits,
passing the digital output signal through a correcting circuit comprising a plurality of correction stages, and
applying calibration coefficients from the storing circuits to the digital output signal in at least one of the correction stages.

In one embodiment of the invention, the method further comprises the step of selecting the correction stages of the correcting circuit through which the digital output signal is passed.

In another embodiment of the invention, the method further comprises the step of selecting the calibration coefficients from the storing circuits to be applied to the digital output signal.

In a further embodiment of the invention, the method further comprises selecting the sequence in which the calibration coefficients are applied to the digital output signal.

Further, the invention provides a method for calibrating a multi-channel ADC comprising an ADC circuit, and a plurality of input terminals for receiving analog input signals from corresponding input channels, the input terminals being sequentially switchable to the ADC circuit, the method comprising the steps of:

applying a calibration reference signal to the ADC circuit for determining a primary calibration coefficient for errors introduced by the ADC circuit, determining the primary calibration coefficient, storing the primary calibration coefficient in a plurality of calibration coefficient registers corresponding to at least some of the respective input channels so that the primary calibration coefficients stored in the respective calibration coefficient registers can be selectively applied to the digital output signals from the ADC circuit resulting from analog input signals on the corresponding input channels for correcting for errors introduced by the ADC circuit, determining secondary calibration coefficients for at least some of the corresponding input channels for which corresponding calibration coefficient registers have been provided, and storing the secondary calibration coefficients in the corresponding calibration coefficient registers by overwriting the primary calibration coefficient already stored in the corresponding calibration coefficient register.

ADVANTAGES OF THE INVENTION

The advantages of the ADC according to the invention are many. By virtue of the fact that two calibration coefficient storing circuits are provided, namely, a primary storing circuit and a secondary storing circuit for storing primary and secondary calibration coefficients, respectively, and since the secondary storing circuit is independent of the primary storing circuit, the secondary calibration coefficients can be written to the secondary storing circuit without altering the primary calibration coefficient stored in the primary storing circuit. Additionally, each of the secondary calibration coefficients stored in the secondary storing circuit can be updated without altering the primary calibration coefficient stored in the primary storing circuit. Indeed, the secondary calibration coefficients can also be updated without altering the other secondary calibration coefficients stored in the secondary storing circuit. Where an interface circuit is provided for facilitating manual writing of secondary calibration coefficients to the secondary storing circuit, manual writing of the secondary calibration coefficients or updating of the secondary calibration coefficients in the secondary storing circuit can be carried out without altering the primary calibration coefficient stored in the primary storing circuit. Additionally, the secondary calibration coefficients can be manually written to or updated in the secondary storing circuit without altering the other stored secondary calibration coefficients. Accordingly, the integrity of the calibration of the ADC circuit can be maintained, while still permitting writing or updating of secondary calibration coefficients to the secondary storing circuit. This has the particular advantage that the ADC circuit of the ADC can be factory calibrated during test and calibration of the ADC, and the resulting calibration coefficient can be written to the primary storing circuit, thus permitting subsequent on-site calibration of the input channels without affecting the stored primary calibration coefficient.

Where the ADC is provided with one or more calibration reference signal sources, calibration of the ADC may be carried out on-site. The ADC circuit may be calibrated on-site, and the primary calibration coefficients can be stored in the primary storing circuit. The secondary calibration coefficients for the respective input channels can then be subsequently and individually determined and written independently to the secondary storing circuit, and again the integrity of the calibration of the ADC circuit is maintained. In cases where the ADC is provided without a calibration reference signal source, or where such a calibration reference signal source is not readily available, by providing the ADC with an interface circuit which permits manual writing of secondary calibration coefficients to the secondary storing circuit, the secondary calibration codes for some or all of the input channels may be manually written through the interface circuit directly to the secondary storing circuit without affecting the primary calibration coefficients stored in the primary storing circuit, or indeed any of the other secondary calibration coefficients stored in the secondary storing circuit.

The advantage of providing the ADC with the bypass circuit which permits selective bypassing of one or both of the primary and secondary correcting circuits is that should faster conversion results be required, one or both of the primary and secondary correcting circuits may be bypassed. In cases where the ADC circuit can be assumed to be error free, or to contain a tolerable level of error, the bypass circuit can be operated so that the digital output signals from the ADC circuit bypass the primary correcting circuit and are applied to the secondary correcting circuit only. In which case, only a single stage correction is carried out for errors introduced by the corresponding input channels. However, where fast conversion results are required and only a single stage error correction is to be carried out on the digital output signals, a recalibration of the ADC can be carried out whereby secondary calibration coefficients can be determined for each input channel, and each secondary calibration coefficient would include correction for both the ADC circuit and the corresponding input channel. These secondary calibration coefficients can then be written to the secondary storing circuit, and can be applied to the digital output signals from the ADC circuit in the secondary correcting circuit. In this case the bypass circuit would be operated for bypassing the primary correcting circuit, and the digital output signals would be simultaneously corrected in the secondary correcting circuit for errors introduced by both the ADC circuit and the corresponding input channel.

Alternatively, should it be desired to correct for errors introduced by the ADC only, the bypass circuit can be operated for bypassing the secondary correcting circuit so that the digital output signals from the ADC circuit would be passed through the primary correcting circuit only. Needless to say, should no correction be required, then the bypass circuit would be operated for bypassing both the primary and secondary correcting circuits.

A further advantage of the invention is achieved where a computation circuit is provided for computing a combined calibration coefficient from the primary and secondary calibration coefficients. In this case, only a single error correction is required, and this can be carried out in the secondary correcting circuit with the bypass circuit operated for bypassing the primary correcting circuit. A still further advantage is achieved when a combined calibration coefficient storing circuit is provided for storing the combined calibration coefficients for the respective input channels, since this avoids the need to compute the combined calibration coefficient for each conversion result. Once the combined calibration coefficients have been computed by the computation circuit once for each input channel, they can be stored in the combined calibration coefficient storing circuit without the need for further computations to be carried out.

A still further advantage of the invention is achieved when the primary gain correction code is stored in the form of a first primary gain correction code and a second primary gain correction code. This permits correction of the digital output signals of value greater than a predetermined value and those of value less than the predetermined value, for example, positive and negative digital output signals, with corresponding gain correction codes, one for positive digital output signals and one for negative output signals. This is a particularly important advantage where the gain errors introduced by the ADC circuit are different for positive and negative digital output signals.

A still further advantage of the invention is achieved when the secondary gain correction codes are stored in the form of first secondary gain correction codes and second secondary gain correction codes. This permits correction of the digital output signals of value greater than the predetermined value and those of value less than the predetermined value, for example, positive and negative digital output signals with corresponding gain correction codes, one for positive digital output signals and one for negative output signals. This is a particularly important advantage where the gain errors introduced by the corresponding input channels are different for positive and negative digital output signals.

The invention will be more clearly understood from the following description of some preferred embodiments thereof, which are given by way of example only, with reference to the accompanying drawings.

DETAILED DESCRIPTION OF THE INVENTION

Figure 1:
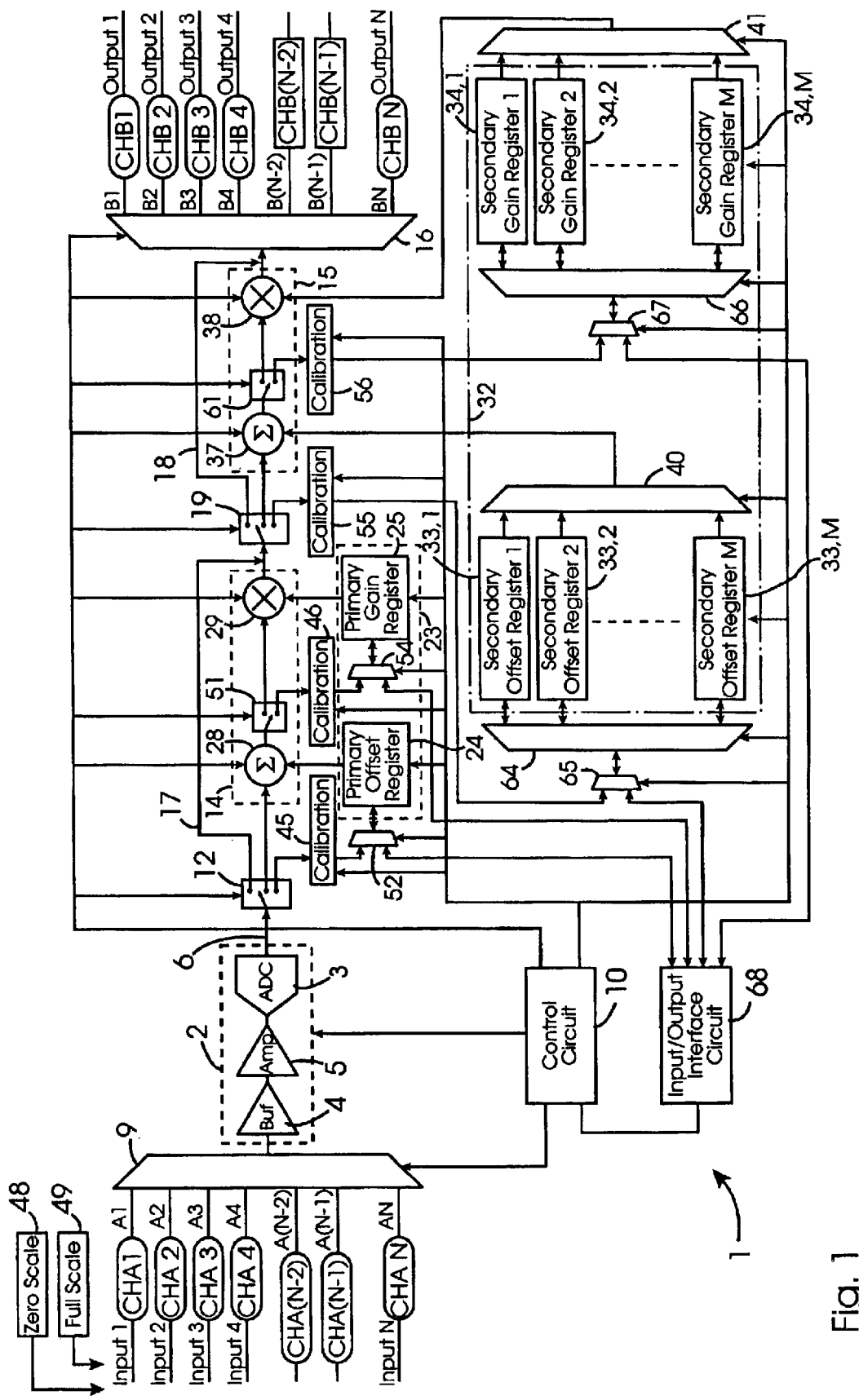
FIG. 1 is a block representation of a multi-channel ADC according to the invention.

Referring to the drawings and initially to FIG. 1, there is illustrated a multi-channel analog to digital converter (ADC) according to the invention, indicated generally by the reference numeral 1, for sequentially converting a plurality of analog signals into corresponding error corrected digital output signals which have been corrected for errors introduced by the multi-channel ADC 1. The ADC 1 is implemented as a single chip integrated circuit and comprises a single ADC circuit 2 for sequentially carrying out the conversions. In this embodiment of the invention the ADC circuit 2 is a twenty-four bit sigma-delta ADC and comprises a converter 3 and a buffer stage 4 and an amplifier stage 5 through which the analog signals are sequentially passed to the converter 3. However, the ADC may be any type of ADC besides a sigma-delta ADC, and may be of any resolution. Uncorrected digital output signals corresponding to the analog input signals are outputted from the ADC circuit 2 on a twenty-four bit output bus 6. However, the output bus 6 may include a number of additional bits. A first main switch network comprising a main multiplexer 9 responsive to a control circuit 10 selectively and sequentially switches a plurality of input terminals A1 to AN to the ADC circuit 2. The analog input signals are applied to the input terminals A1 to AN through input channels CHA1 to CHAN, respectively.

Some or all or part of the input channels CHA1 to CHAN may be provided on the same integrated circuit chip as the ADC 1, but more typically will be off-chip channels external to the chip on which the ADC 1 is fabricated. Some or all of the input channels CHA1 to CHAN may introduce offset and gain errors to the analog signals passing through the respective input channels CHA1 to CHAN, and where all or part of the input channels CHA1 to CHAN are provided off-chip, such input channels will, in general, include components external to the chip, and the offset and gain errors introduced by such input channels CHA1 to CHAN could not be corrected for during factory test and calibration of the ADC 1. Additionally, the ADC circuit 2 introduces offset and gain errors to the signals as they are being converted, however, such offset and gain errors can be taken account of during factory test and calibration of the ADC 1, as will be described below.

The digital output signals on the output bus 6 are selectively passed through a correcting circuit which comprises a primary correcting circuit 14 and a secondary correcting circuit 15 to a second main switch network, namely, a main demultiplexer 16. The primary and secondary correcting circuits 14 and 15 are twenty-four bit circuits, although they may include additional bits. The main demultiplexer 16 under the control of the control circuit 10 selectively switches the digital output signals to output terminals B1 to BN corresponding to the input terminals A1 to AN, and are written to corresponding output channel registers CHB1 to CHBN corresponding to the respective input channels CHA1 to CHAN. A bypass circuit comprising a primary bypass circuit 17 and a secondary bypass circuit 18 is provided for selectively bypassing the primary and secondary correcting circuits 14 and 15, respectively. A first switch circuit 12 under the control of the control circuit 10 selectively switches the digital output signals on the output bus 6 to one or other of the primary correcting circuit 14 and the primary bypass circuit 17. A second switch circuit 19 under the control of the control circuit 10 selectively switches the digital output signals from the primary correcting circuit 14 and the primary bypass circuit 17 to one of the secondary correcting circuit 15 and the secondary bypass circuit 18.

The primary correcting circuit 14 corrects the digital output signals for offset and gain errors introduced by the ADC circuit 2 as will be described below, while the digital output signals switched through the primary bypass circuit 17 are uncorrected for offset and gain errors introduced by the ADC circuit 2. The secondary correcting circuit 15 corrects the digital output signals for offset and gain errors introduced in the respective input channels CHA1 to CHAN, while those digital output signals switched through the secondary bypass circuit 18 are uncorrected for offset and gain errors introduced by the respective input channels CHA1 to CHAN. Additionally, as will be described below the secondary correcting circuit 15 may also correct for offset and gain errors introduced by both the ADC circuit 2 and the input channels CHA1 to CHAN.

The respective first and second switch circuits 12 and 19 are operable under the control of the control circuit 10 for selectively switching the digital output signals through both of the primary correcting circuit 14 and the secondary correcting circuit 15, or through one of the primary and secondary correcting circuits 14 and 15 only, or through the respective primary and secondary bypass circuits 17 and 18 so that both the primary and secondary correcting circuits 14 and 15 are bypassed.

A primary storing circuit 23 is provided for storing a primary calibration coefficient, in this embodiment of the invention a primary offset correction code and a primary gain correction code for correcting the digital output signals from the ADC circuit 2 for offset and gain errors, respectively, introduced by the ADC circuit 2. The primary storing circuit 23 comprises a primary offset register 24 and a primary gain register 25. The primary offset register 24 stores the primary offset correction code, and the primary gain register 25 stores the primary gain correction code. The determination and writing of the primary offset and gain correction codes to the respective primary offset and gain registers 24 and 25 will be described below. The primary correcting circuit 14 comprises a primary adder element 28, which is operated under the control of the control circuit 10, for adding the primary offset correction code stored in the primary offset register 24 to the digital output signals as they pass through the primary correcting circuit 14. In this embodiment of the invention the primary offset correction code is stored in the primary offset register 24 as a negative value, although it may be stored as a positive or a negative value. A primary multiplying element 29 in the primary correcting circuit 14, under the control of the control circuit 10 multiplies the digital output signals passing through the primary correcting circuit 14 by the primary gain correction code stored in the primary gain register 25. The primary multiplying element 29 may be implemented by any suitable multiplying element, however, in this embodiment of the invention the primary multiplying element 29 is implemented as a shift and add routine element. The primary adder element 28 and the primary multiplying element 29 are arranged in the primary correcting circuit 14 so that the digital output signals from the ADC circuit 2 are first corrected for offset error, and are then corrected for gain error.

A secondary storing circuit 32 is provided for storing a plurality of secondary correction coefficients, in this embodiment of the invention secondary offset correction codes and secondary gain correction codes for correcting for errors introduced in the corresponding input channels CHA1 to CHAN. However, as will be described below, the secondary offset and gain correction codes may be codes for correcting the digital output signals for offset and gain errors introduced by the corresponding ones of the input channels CHA1 to CHAN only through which the respective corresponding analog signals pass, or the secondary offset and gain correction codes may be codes for correcting the digital output signals for offset and gain errors introduced by both the corresponding ones of the input channel CHA1 to CHAN and the ADC circuit 2. The secondary storing circuit 32 comprises a plurality of secondary offset registers 33 and a plurality of secondary gain registers 34. The secondary offset registers 33 store the secondary offset correction codes for the respective corresponding input channels CHA1 to CHAN, and the secondary gain registers 34 store the secondary gain correction codes for the respective corresponding input channels CHA1 to CHAN.

In this embodiment of the invention there are M secondary offset registers 33 and M secondary gain registers 34, while there are N input channels CHA1 to CHAN. Two of the input channels, namely, CHA(N−1) and CHA(N−2) are reserved for test purposes as will be described below, and accordingly, there are no secondary offset and gain registers 33 and 34 provided to correspond to these two channels. Therefore M=N−2. The first secondary offset and gain registers 33,1 and 34,1 correspond to the input channel CHA1, while the second secondary offset and gain registers 33,2 and 34,2 correspond to the second input channel CHA2, and so on up to the M secondary offset and gain registers 33,M and 34,M which correspond to the input channel CHAN. The determination and the writing of the respective secondary offset and gain correction codes into the respective secondary offset and gain registers 33 and 34 will be described below.

The secondary correcting circuit 15 comprises a secondary adder element 37 for adding the secondary offset correction codes from the appropriate ones of the secondary offset registers 33 to the corresponding digital output signals under the control of the control circuit 10. A secondary multiplying element 38 is also provided in the secondary correcting circuit 15 for multiplying the corresponding digital output signals with the secondary gain correction codes from the appropriate ones of the secondary gain registers 34 under the control of the control circuit 10. The secondary multiplying element 38 may be implemented by any suitable multiplying element, and in this embodiment of the invention is implemented by a shift and add routine element. The secondary adder element 37 and the secondary multiplying element 38 are arranged in the secondary correcting circuit 15 so that the respective digital output signals are first corrected for offset errors and are then corrected for gain errors. Additionally, the respective primary and secondary correcting circuits 14 and 15 are arranged so that the digital output signals are first subjected to correction with the primary offset and gain correction codes and are then subjected to correction with the secondary offset and gain correction codes.

A first secondary output switch circuit comprising a first secondary output multiplexer 40 operating under the control of the control circuit 10 selectively switches the appropriate one of the secondary offset registers 33 to the secondary adder element 37 for applying the appropriate secondary offset correction code to the secondary adder element 37 for each digital output signal. The control circuit 10 outputs a control signal to the first secondary output multiplexer 40 so that each time an input channel CHA1 to CHAN is selected the corresponding secondary offset register 33 is selected. A second secondary output switch circuit comprising a second secondary output multiplexer 41 operating under the control of the control circuit 10 selectively switches the appropriate one of the secondary gain registers 34 to the secondary multiplying element 38 for applying the appropriate secondary gain correction code to the secondary multiplying element 38 for each digital output signal. The control circuit 10 outputs a control signal to the second secondary output multiplexer 41 so that each time an input channel CHA1 to CHAN is selected the corresponding secondary gain register 34 is selected.

A primary offset code determining circuit 45 is provided for determining the primary offset correction code for correcting for offset errors introduced by the ADC circuit 2. A primary gain code determining circuit 46 is provided for determining the primary gain correction code for correcting for gain errors introduced by the ADC circuit 2. In this embodiment of the invention first and second calibration reference signal sources comprising a zero scale voltage source 48 and a positive full scale voltage source 49, respectively, are provided for determining the offset and gain errors introduced by the ADC circuit 2, and also by the input channels CHA1 to CHAN. The zero scale voltage source 48 is applied directly to the input terminal A(N−2), and the full scale voltage source 49 is applied directly to the input terminal A(N−1). During determination of the primary offset and gain correction codes the respective zero and full scale voltage sources 48 and 49 are sequentially switched through the ADC circuit 2 by the main multiplexer 9 under the control of the control circuit 10.

The value of the full scale voltage from the full scale voltage source 49 is selected to be of value similar to the maximum voltage of the analog input signals to be converted by the ADC I. In general, the maximum value will be the same for each channel, however, where the maximum voltage of the analog input signals may differ from input channel to input channel, when correcting for gain errors introduced by the respective input channels, the value of the full scale voltage would be appropriately set for the respective channels to be similar to the maximum voltage of the analog signals to be converted by those input channels. The zero and full scale voltages from the zero and full scale voltage sources may if required be used for determining the offset and gain correction codes for the input channels where a zero scale voltage and a full scale voltage are required for calibration of such input channels, and the zero and full scale voltages can be conveniently applied to the input channels.

A first primary calibration switch, which in this embodiment of the invention is incorporated in the first switch circuit 12, selectively switches the digital output word resulting from the zero scale voltage source 48 to the primary offset code determining circuit 45 for determining the primary offset correction code for the ADC circuit 2. The first switch circuit 12 is operated under the control of the control circuit 10 for switching the digital output word resulting from the zero scale voltage to the primary offset code determining circuit 45. The digital output word from the ADC circuit 2 resulting from the zero scale voltage is effectively the primary offset correction code. The primary offset code determining circuit 45 converts the digital output word from the ADC circuit 2 to twos complement arithmetic, and a sign bit is assigned to the primary offset correction code, depending on whether the value of the digital output word from the ADC circuit 2 is greater than or less than zero. The primary offset code determined by the primary offset code determining circuit 45 is then written to the primary offset register 24 under the control of the control circuit 10. The primary offset correction code is written to the primary offset register 24 through a first primary multiplexer 52 under the control of the control circuit 10. The first primary multiplexer 52, as will be described below, is provided for facilitating manual writing of a primary offset correction code into the primary storing register 24.

A second primary calibration switch 51 operated under the control of the control circuit 10 is located in the primary correcting circuit 14 for selectively switching the digital output signal from the ADC circuit 2 into the primary gain code determining circuit 46 for determining the primary gain correction code. The primary gain correction code is determined after the primary offset correction code has been determined and is stored in the primary offset register 24. To determine the primary gain correction code, the full scale voltage from the full scale voltage source 49, which is applied to the input terminal A(N−1), is switched under the control of the control circuit 10 by the main multiplexer 9 through the ADC circuit 2 into the primary correcting circuit 14. The primary offset correction code stored in the primary offset register 24 is applied to the digital output word resulting from the full scale voltage by the primary adder element 28, and the second primary calibration switch 51 is operated for switching the offset corrected digital output word into the primary gain code determining circuit 46. The primary gain code determining circuit 46 determines the ratio of the offset corrected digital output word to an ideal digital word corresponding to the full scale voltage, and the ratio is written into the primary gain register 25 under the control of the control circuit 10 as the primary gain correction code. The primary gain correction code is written to the primary gain register 25 through a second primary multiplexer 54 operated under the control of the control circuit 10. The second primary multiplexer 54 is provided for facilitating manual writing of a primary gain correction code into the primary gain register 25 as will be described below.

A secondary offset code determining circuit 55 and a secondary gain code determining circuit 56 are provided for determining the respective secondary offset correction codes and the respective secondary gain correction codes. The secondary offset and gain code determining circuits 55 and 56 are similar to the primary offset and gain code determining circuits 45 and 46 already described. A first secondary calibration switch for switching digital output signals to the secondary offset code determining circuit 55 in this embodiment of the invention is incorporated in the second switch circuit 19, and under the control of the control circuit 10 digital output words resulting from the zero scale voltage, or other appropriate zero scale signals, applied to the respective input channels CHA1 to CHAN are switched to the secondary offset code determining circuit 55 for determining the secondary offset correction codes for the respective input channels CHA1 to CHAN. A second secondary calibration switch 61 in the secondary correcting circuit 15 switches the digital output words resulting from the full scale voltage, or other appropriate full scale signals, applied to the respective input channels CHA1 to CHAN, from the secondary correcting circuit 15 under the control of the control circuit 10 to the secondary gain code determining circuit 56. The procedure for determining the secondary offset and gain correction codes for the input channels CHA1 to CHAN will be described below.

A first secondary input switch circuit comprising a first secondary demultiplexer 64 operated under the control of the control circuit 10 selects the appropriate one of the secondary offset registers 33 which corresponds to the input channel CHA1 to CHAN, the secondary offset correction code for which is being determined, for writing the determined secondary offset correction code into the selected secondary offset register 33. The secondary offset correction codes are written to the corresponding secondary offset registers 33 through the first secondary demultiplexer 64 and through a first secondary input multiplexer 65 under the control of the control circuit 10. The first secondary input multiplexer 65 is provided for facilitating manual writing of the respective secondary offset correction codes into the respective secondary offset registers 33 as will be described below. A second secondary input switch circuit provided by a second secondary demultiplexer 66 operated under the control of the control circuit 10 selects the secondary gain register 34 corresponding to the input channel CHA1 to CHAN for which the secondary gain correction code is being determined for writing the determined secondary gain correction code into the selected secondary gain register 34. The secondary gain correction codes are written to the corresponding secondary gain registers 34 through the second secondary demultiplexer 66 and through a second secondary input multiplexer 67 under the control of the control circuit 10. The second secondary input multiplexer 67 is provided for facilitating manual writing of respective secondary gain correction codes into the respective secondary gain registers 34 as will be described below.

Determination of the secondary offset correction codes and the secondary gain correction codes by the respective secondary offset code determining circuit 55 and the secondary gain code determining circuit 56, in principle is similar to the determination of the primary offset and gain correction codes already described. As mentioned above, the secondary offset and gain registers 33 and 34 may store respective secondary offset and gain correction codes for correcting for offset and gain errors introduced by the corresponding input channels CHA1 to CHAN only, or the secondary offset and gain registers 33 and 34 can store secondary offset and gain correction codes for correcting for offset and gain errors introduced by both the corresponding input channels CHA1 to CHAN and the ADC circuit 2. Where it is desired to store secondary offset and gain correction codes in the respective secondary offset and gain registers 33 and 34 to correct for offset and gain errors introduced by the input channels CHA1 to CHAN only, the primary offset and gain correction codes for the ADC circuit 2 must first be determined and stored in the primary offset and gain registers 24 and 25. The secondary offset and gain correction codes are then determined for the input channels CHA1 to CHAN with the exception of the input channels CHA(N−1) and CHA(N−2). The secondary offset correction code is determined before the secondary gain correction code is determined for each input channel.

Briefly, to determine the secondary offset correction code for the first input channel CHA1, the zero scale voltage, or other appropriate zero scale signal, is applied to the input channel CHA1 which is switched by the main multiplexer 9 under the control of the control circuit 10 to the ADC circuit 2. The digital output word corresponding to the zero scale voltage or the appropriate zero scale signal is corrected in the primary correcting circuit 14 for offset and gain errors introduced by the ADC circuit 2 by applying the primary offset and gain correction codes to the digital output word, and the digital output word so corrected is switched by the second switch circuit 19 to the secondary offset code determining circuit 55. The first secondary demultiplexer 64 is operated under the control of the control circuit 10 for selecting the secondary offset register 33 corresponding to the first input channel CHA1, and the first secondary input multiplexer 65 is appropriately switched by the control circuit 10. The secondary offset correction code is determined from the digital output word by the secondary offset code determining circuit 55, as already described with reference to the primary offset code determining circuit 45, and the secondary offset correction code for the first input channel CHA1 is written into the corresponding secondary offset register 33 under the control of the control circuit 10.

To determine the secondary gain correction code for the first input channel CHA1 the full scale voltage, or other appropriate full scale signal, is applied to the first input channel CHA1 and is switched by the main multiplexer 9 to the ADC circuit 2. The digital output word from the ADC circuit 2 resulting from the full scale voltage or the appropriate full scale signal is corrected in the primary correcting circuit 14 for offset and gain errors introduced by the ADC circuit 2 as already described, and the digital output word so corrected is then corrected for offset errors introduced by the first input channel CHA1 by applying the just stored secondary offset correction code to the digital output word by the secondary adder element 37. The channel offset corrected digital output word is then switched by the second secondary calibration switch 61 to the secondary gain code determining circuit 56 where the secondary gain correction code is determined. The second secondary demultiplexer 66 is operated under the control of the control circuit 10 for selecting the secondary gain register 34 corresponding to the first input channel CHA1, and the second secondary input multiplexer 67 is appropriately switched under the control of the control circuit 10. The determined secondary gain correction code is written into the secondary gain register 34 under the control of the control circuit 10. After the secondary offset and gain correction codes have been determined for the first input channel CHA1 and written into the corresponding secondary offset and gain registers 33 and 34, the secondary offset and gain correction codes for the next input channel, for example, the second input channel CHA2 are then determined in similar fashion and written into the secondary offset and gain registers 33 and 34 corresponding to the second input channel CHA2.

On the other hand, should it be desired that the secondary offset and gain correction codes stored in the secondary offset and gain registers 33 and 34 should correct simultaneously for offset and gain errors introduced by the respective input channels CHA1 to CHAN and the ADC circuit 2, the procedure for determining the secondary offset and gain correction codes is as follows. However, in this case, since the offset and gain errors introduced by the ADC circuit 2 are being taken account of in the respective secondary offset and gain correction codes, the primary correcting circuit 14 is bypassed by operating the first and second switch circuits 12 and 19 so that the digital output signals from the ADC circuit 2 are passed through the primary bypass circuit 17 and the secondary correcting circuit 15 to the main demultiplexer 16. To determine the secondary offset correction code for the combination of the first input channel CHA1 and the ADC circuit 2, the zero scale voltage, or other appropriate zero scale signal, is applied to the first input channel CHA1, and the main multiplexer 9 is operated under the control of the control circuit 10 for switching the first input channels CHA1 to the ADC circuit 2. The digital output word from the ADC circuit 2 resulting from the zero scale voltage or the appropriate zero scale signal is passed through the primary bypass circuit 17 to the second switch 19. The second switch circuit 19 is operated for directing the digital output word to the secondary offset code determining circuit 55, which determines the secondary offset correction code for the first input channel CHA1 and the ADC circuit 2. The first secondary demultiplexer 64 is operated for selecting the secondary offset register 33 corresponding to the first input channel CHA1. The first secondary input multiplexer 65 is also appropriately switched. The secondary offset correction code determined by the secondary offset code determining circuit 55 is then written to the selected secondary offset register 33 corresponding to the first input channel CHA1 under the control of the control circuit 10.

The full scale voltage, or other appropriate full scale signal, is then switched to the first input channel CHA1 which is switched to the ADC circuit 2 by the main multiplexer 9 under the control of the control circuit 10. The digital output word resulting from the full scale voltage or the appropriate full scale signal is passed through the primary bypass circuit 17 to the secondary correcting circuit 15, where the secondary adder element 37 applies the just stored secondary offset correction code for the first input channel CHA1 to the digital output word for correcting the digital output word for offset errors introduced by the first input channel CHA1 and the ADC circuit 2. The second secondary calibration switch 61 is then operated for switching the offset error corrected digital output word to the secondary gain code determining circuit 56 where the secondary gain correction code is determined. The second secondary demultiplexer 66 is operated for selecting the secondary gain register 34 corresponding to the first input channel CHA1, and the second secondary input multiplexer 67 is operated for switching the secondary gain code determining circuit 56 to the second secondary demultiplexer 66. The determined secondary gain correction code is written to the selected secondary gain register 34 under the control of the control circuit 10. At this stage the secondary offset correction code and the secondary gain correction code for correcting for errors introduced by the first input channel CHA1 and the ADC circuit 2 are now stored in the corresponding secondary offset and gain registers 33 and 34. The secondary offset and gain correction codes for the combination of the next input channel, for example, the second input channel CHA2 and the ADC circuit 2 are next determined and stored in the secondary offset and gain registers 33 and 34 corresponding to the second input channel CHA2, and so on.

An interface circuit 68 is provided for facilitating manual inputting of primary and secondary offset and gain correction codes into the respective primary and secondary offset and gain registers 24 and 25, and 33 and 34. The interface circuit 68 also facilitates manual outputting of the primary and secondary offset correction codes stored in the primary and secondary offset and gain registers 24 and 25, and 33 and 34, so that the stored codes can be read. Should it be desired to manually write the primary offset and gain correction codes into the primary offset and gain registers 24 and 25, the respective first and second primary multiplexers 52 and 54 are operated under the control of the control circuit 10 for switching the primary offset and gain registers 24 and 25 to the interface circuit 68. The respective primary offset and gain correction codes are then inputted through the interface circuit 68 and written to the primary offset and gain registers 24 and 25 under the control of the control circuit 10.

Similarly, should it be desired to manually write secondary offset and gain correction codes into the secondary offset and gain registers 33 and 34 corresponding to any one or more of the input channels CHA1 to CHAN, the first and second secondary input multiplexers 65 and 67 are operated under the control of the control circuit 10 for switching the interface circuit 68 to the corresponding first and second secondary demultiplexers 64 and 66 under the control of the control circuit 10. The secondary offset and gain registers 33 and 34 corresponding to the input channel for which it is desired to enter the offset and gain correction codes are selected by the first and second secondary demultiplexers 64 and 66 under the control of the control circuit 10. Once the secondary offset and gain registers 33 and 34 corresponding to the input channel for which the secondary offset and gain correction codes are to be manually written are selected, the respective secondary offset and gain correction codes are entered through the interface circuit 68, and are written to the selected secondary offset and gain registers 33 and 34 under the control of the control circuit 10.

To read out the primary and secondary offset and gain correction codes from the respective primary and secondary offset and gain registers 24 and 25, and 33 and 34, the first and second primary multiplexers 52 and 54, and the first and second secondary input multiplexers 65 and 67 are appropriately operated for communicating the primary and secondary offset and gain registers 24 and 25, and 33 and 34 with the interface circuit 68, and in the case of the secondary offset and gain registers 33 and 34, the secondary offset and gain registers 33 and 34 from which it is desired to read the secondary offset and gain correction codes are selected by the first and second secondary demultiplexers 64 and 66, and the respective correction codes are read out through the interface circuit 68 for use off-chip.

It is envisaged that in general the primary offset and gain correcting codes for the ADC circuit 2 will be determined and stored in the respective primary offset and gain registers 24 and 25 during initial factory test and calibration of the ADC 1 using the zero and full scale voltage sources 48 and 49. However, subsequent determination of the primary offset and gain correction codes may be carried out using the zero and full scale voltage sources 48 and 49, or by applying other appropriate zero and full scale signals to the input channels. Alternatively, the primary offset and gain correction codes may be determined by other means, and the determined primary offset and gain correction codes could be manually written to the primary offset and gain registers 24 and 25 through the interface circuit 68. In general, it is envisaged that the secondary offset and gain correction codes for the input channels CHA1 to CHAN will be determined on-site as already described or by computation and manually entered.

In use, where it is desired to operate the ADC 1 for correcting the digital output signals separately for offset and gain errors introduced by the ADC circuit 2 on the one hand, and offset and gain errors introduced by the respective input channels CHA1 to CHAN on the other hand, primary offset and gain correction codes corresponding to the offset and gain errors introduced by the ADC circuit 2 are stored in the primary offset and gain registers 24 and 25, and secondary offset and gain correction codes for correcting for offset and gain errors introduced by the respective input channels CHA1 to CHAN only are stored in the secondary offset and gain registers 33 and 34 corresponding to the respective input channels CHA1 and CHAN. The ADC 1 is then ready for use, and analog signals on the respective input channels CHA1 and CHAN are sequentially converted in the ADC circuit 2 to digital output signals. The digital output signals are first corrected in the primary correcting circuit 14 by applying the primary offset and gain correction codes to the digital output signals. The digital output signals are then corrected in the secondary correcting circuit 15 by applying the secondary offset and gain correction codes to the digital output signals corresponding to the input channels CHA1 to CHAN through which the analog signals passed, from which the digital output signals have been derived.

In certain cases, with the ADC 1 set up as just described, it may be desired to correct the digital output signals, derived from the analog signals from some input channels, for offset and gain errors introduced by the ADC circuit 2 only. In which case, when such input channels are selected by the main multiplexer 9, the second switch circuit 19 is operated for switching the corresponding digital output signals through the secondary bypass circuit 18 directly to the main demultiplexer 16. Similarly, should it be desired in certain cases to correct only for errors introduced by some of the input channels, when those input channels are selected by the main multiplexer 9, the first switch circuit 12 is operated for switching the digital output signals from the ADC circuit 2 through the primary bypass circuit 17 directly to the second switch circuit 19, which in turn directs the digital output signals through the secondary correcting circuit 15, where those digital output signals are corrected for errors introduced by the corresponding input channels only.

On the other hand, should it be desired not to correct digital output signals converted from analog signals from some of the input channels for offset and gain errors introduced by both the channel or channels and the ADC circuit 2, the first switch circuit 12 and the second switch circuit 19 are operated for directing the digital output signals directly through the primary bypass circuit 17 and the secondary bypass circuit 18, respectively, to the main demultiplexer 16.

Additionally, as discussed above, the ADC 1 can be operated to simultaneously correct for offset and gain errors introduced by the ADC circuit 2 and the respective input channels. In which case, the ADC 1 is set up with the secondary offset and gain correction codes which are stored in the secondary offset and gain registers 33 and 34 being such as to correct for both the offset and gain errors introduced by the ADC circuit 2 and the respective corresponding input channels simultaneously. In this case, the ADC 1 is operated for converting analog signal on the input channels CHA1 to CHAN, with the first switch circuit 12 operated for directing the digital output signals through the primary bypass circuit 17. The second switch circuit 19 is operated for directing the digital output signals through the secondary correcting circuit 15, where the digital output signals are corrected for errors introduced by both the ADC circuit 2 and the respective corresponding input channels by applying the respective corresponding secondary offset and gain correction codes to the digital output signals. The corrected digital output signals are then passed from the secondary correcting circuit 15 to the main demultiplexer 16.

Additionally, if desired, some or all of the secondary offset and gain correction codes may be manually entered and written into the secondary offset and gain registers 33 and 34 through the interface circuit 68. While the primary offset and gain correction codes can be manually entered into the primary offset and gain registers 24 and 25 through the interface circuit 68, in practice, it is envisaged that the primary offset and gain correction codes will be written into the primary offset and gain registers 24 and 25 by the primary offset and gain code determining circuits 45 and 46.

Additionally, the ADC 1 may be operated for determining the primary offset and gain correction codes for the ADC circuit 2 only, and when the primary offset and gain correction codes have been determined, the primary offset and gain correction codes could be written simultaneously or sequentially into each and every one of the corresponding secondary offset and gain registers, respectively, the primary offset correction code being written into the secondary offset registers, and the primary gain correction code being written into the secondary gain registers. The primary offset and gain correction codes may be determined in either the primary offset code determining circuit 45 and the primary gain code determining circuit 46 respectively, or in the secondary offset code determining circuit 55 and the secondary gain code determining circuit 56 as already described.

Alternatively, if the primary offset and gain correction codes have already been stored in the primary offset and gain registers 24 and 25, they may be read from the primary offset and gain registers 24 and 25 under the control of the control circuit 10 and written into each of the secondary offset and gain registers, 33 and 34, respectively. The ADC 1 would then be operated for carrying out conversions with the primary bypass circuit 17 selected by the first is switch circuit 12 and the secondary correcting circuit 15 selected by the second switch circuit 19. In this way each digital output signal is corrected in the secondary correcting circuit 15 only for errors introduced by the ADC circuit 2 only. However, an advantage of using the ADC 1 in this configuration is that the primary offset and gain correction codes stored in some of the secondary offset and gain registers may be overwritten by secondary offset and gain correction codes which would correct for offset and gain errors introduced by the ADC circuit 2 and the corresponding input channel. The secondary offset and gain correction codes to be overwritten into the secondary offset and gain registers may be manually written through the interface circuit 68, or a calibration may be carried out for the one or more of such input channels, using the secondary offset and gain code determining circuits 55 and 56. The secondary offset and gain correction codes to be overwritten into the secondary offset and gain registers 33 and 34 when being determined by the secondary offset and gain code determining circuits 55 and 56 would be determined with the primary correcting circuit 14 bypassed so that the secondary offset and gain correction codes determined by the secondary offset and gain code determining circuits 55 and 56 would correct for errors introduced by both the relevant input channel and the ADC circuit 2.

Figure 2:
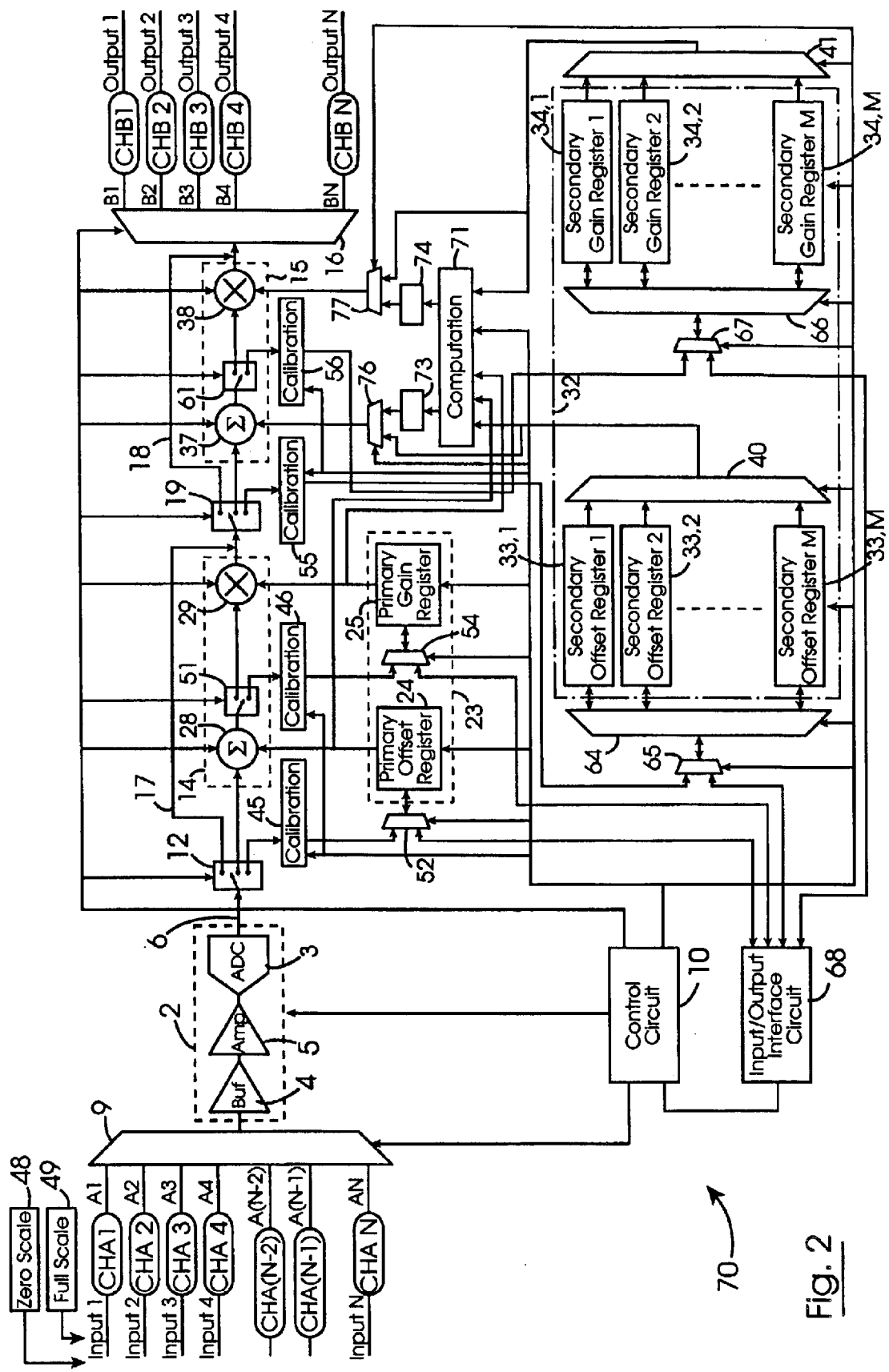
FIG. 2 is a block representation of the multi-channel ADC according to another embodiment of the invention.

Referring now to FIG. 2, there is illustrated a multi-channel ADC 70 according to another embodiment of the invention. The ADC 70 is substantially similar to the ADC 1 and similar components are identified by the same reference numerals. The main difference between the ADC 70 and the ADC 1 is that the ADC 70 comprises a computation circuit 71 for computing a combined calibration coefficient for each input channel CHA1 to CHAN from the primary calibration coefficient and the corresponding secondary calibration coefficient, in other words, from the primary offset and gain correction codes, and the corresponding secondary offset and gain correction codes stored in the primary and secondary offset and gain registers 24 and 25, and 33 and 34. In this embodiment of the invention the ADC 70 is operable in all the modes of operation in which the ADC 1 is operable for calibration and for carrying out conversions subsequently. However, in addition to these modes the ADC 70 is to operable for carrying out conversion subsequent to calibration whereby the digital output signals are corrected by a combined calibration coefficient computed in the computation circuit 71. The computation circuit 71, as will be described below, computes two calibration code elements, namely, a first calibration code element and a second calibration code element, both of which are described in detail below. The first calibration code element is stored in a first calibration code register 73, and the second calibration code element is stored in a second calibration code register 74.

The first calibration code element is applied to the corresponding digital output signal by a first adder element, which is provided by the secondary adder element 37. The corresponding digital output signal is multiplied by the second calibration code element by a first multiplying element, namely, provided by the secondary multiplying element 38. A first multiplexer 76 is provided for selectively switching either the first secondary output multiplexer 40 or the first calibration code register 73 to the secondary adder element 37, depending on whether a corresponding secondary offset code from the secondary offset register is to be applied to the digital output signal by the secondary adder element 37, or the first calibration code element stored in the first calibration code register 73 is to be applied to the corresponding digital output signal by the secondary adder element 37. A second multiplexer 77 selectively switches either the second secondary output multiplexer 41 or the second calibration code register 74 to the secondary multiplying element 38, again depending on whether the digital output signal is to be corrected with the secondary gain correction code or the second calibration code element.

The first and second calibration code elements of the combined calibration coefficient may be any of a number of first and second calibration code elements.

Figure 3:
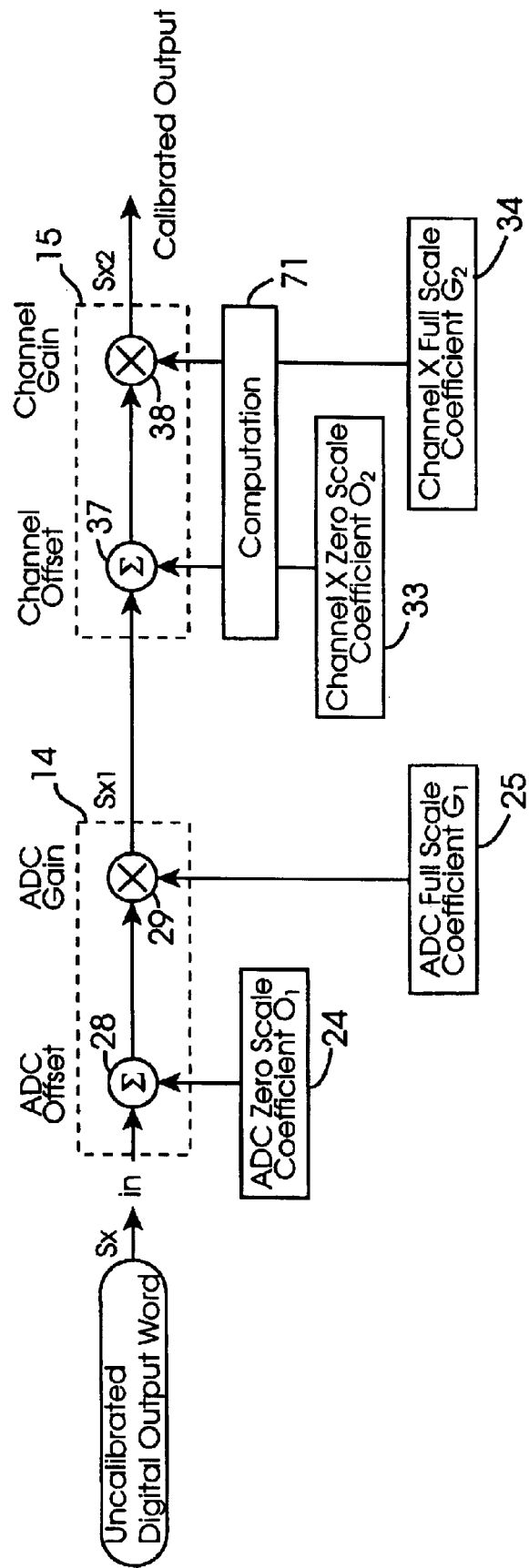
FIG. 3 is a diagrammatic block representation of a portion of the ADC of FIG. 2.

Referring now to FIG. 3, there is illustrated a diagrammatic block representation of a portion of the ADC circuit 70 which illustrates the primary offset and gain registers 24 and 25, and one of each of the secondary offset and gain registers 33 and 34 for storing the offset and gain correction codes, respectively for channel X of the input channels CHA1 to CHAN. The digital output signal of channel X from the ADC circuit 2 is represented by the designation $S_x$. The fully corrected digital output signal which has been corrected by the primary and secondary offset and gain correction codes in the primary and secondary offset and gain registers is designated $S_{x2}$. The partially corrected digital output signal which has been corrected by the primary offset and gain correction codes is designated $S_{x1}$.

Accordingly, if $O_1$ represents the primary offset correction code for the ADC circuit 2, $G_1$ represents the primary gain correction code for the ADC circuit 2, $O_2$ represents the secondary offset correction code for channel X only, and $G_2$ represents the secondary gain correction code for channel X only $$
\begin{aligned}
\therefore \quad S_{x1} &= (S_x - O_1) \cdot G_1 & (1) \\
S_{x2} &= (S_{x1} - O_2) \cdot G_2 & (2) \\
&= [(S_x - O_1) \cdot G_1 - O_2] \cdot G_2 & (3) \\
&= G_1 \cdot G_2 \cdot S_x - G_1 \cdot G_2 \cdot O_1 - G_2 \cdot O_2 & (4) \\
&= (G_1 \cdot G_2 \cdot S_x) - (G_1 \cdot G_2 \cdot O_1 + G_2 \cdot O_2) & (5) \\
S_{x2} &= G_1 \cdot G_2[S_x - (O_1 + O_2/G_1)] & (6) \\
&= A[S_x - B] & (7) \\
\text{where} \quad A &= G_1 \cdot G_2 & (8) \\
B &= (O_1 + O_2/G_1) & (9) \\
S_{x2} &= G_1 \cdot G_2 \cdot S_x - G_1 \cdot G_2(O_1 + O_2/G_1) & (10) \\
&= A \cdot S_x - A \cdot B & (11)
\end{aligned}
$$

From equations (6) to (9), it can be seen that the term A in equations (7) and (8) which is equal to the product of the gains is a gain term. The term B which is equal to $(O_1+O_2/G_1)$ is an offset term. Accordingly, one form of the first calibration code element can be the term $B=(O_1+O_2/G_1)$, and the second calibration code element can be the gain term A, namely, the product of the gains $G_1$ and $G_2$. When arranged in the form of equations (6) and (7), the first calibration code element, namely, the term B is applied to the corresponding digital output signal by the secondary adder element 37, prior to the gain term A being applied to the digital output signal by the secondary multiplying element 38. When the equation is written in the form of equations (10) and (11) the gain term A should be applied to the corresponding digital output signal by the secondary multiplying element 38 prior to the offset term B being applied to the corresponding digital output signal by the secondary adder element 37. This, however, would require rearranging of the secondary adder element 37 and the secondary multiplying element 38 so that the gain term A is applied to the digital output signal prior to the offset term B being added to the digital output signal.

However, it will be readily apparent to those skilled in the art that the primary and secondary offset and gain correction codes may be combined in many other forms besides those set out in equations (3) to (11), and the appropriate first and second calibration code elements would be appropriately computed by the computation circuit 71, and stored in the first and second calibration code registers 73 and 74.

In use, the ADC 70 may be calibrated using any of the methods already described with reference to FIG. 1. Additionally, the ADC 70 may be operated to convert analog signals on the input channels CHA1 to CHAN with correction for errors introduced by either or both the input channels and the ADC circuit 2. However, in addition, when the ADC 70 has been calibrated with the primary offset and gain correction codes stored in the primary offset and gain registers 24 and 25 for correcting for errors introduced by the ADC circuit 2, and the secondary offset and gain correction codes for correcting for errors introduced by the input channels CHA1 to CHAN only stored in the secondary offset and gain registers 33 and 34, the ADC 70 may be operated to correct for errors introduced by the input channels CHA1 to CHAN and the ADC circuit 2 using the combined calibration coefficient. In which case, the first switch circuit 12 is operated for selecting the primary bypass circuit 17 so that the digital output signals from the ADC circuit 2 bypass the primary correcting circuit 14. The second switch circuit 19 is operated for selecting the secondary correcting circuit 15, so that the uncorrected digital output signals are passed into the secondary correcting circuit 15. The first multiplexer 76 and the second multiplexer 77 are operated under the control of the control circuit 10 for switching the first and second calibration code registers 73 and 74 to the secondary adder element 37 and the secondary multiplying element 38, respectively.

The computation circuit 71 reads the primary offset and gain correction codes from the primary offset and gain registers 24 and 25. As the input channels CHA1 to CHAN are being selected by the main multiplexer 9 under the control of the control circuit 10, the corresponding secondary offset and gain registers 33 and 34 are selected by the first and second secondary output multiplexers 40 and 41, and the corresponding secondary offset and gain correction codes are read into the computation circuit 71. The computation circuit 71 computes the respective first and second calibration code elements from the primary offset and gain correction codes and the corresponding secondary offset and gain correction codes. The computed first and second calibration code elements are written to the first and second calibration code registers 73 and 74, and in turn applied to the corresponding digital output signal by the secondary adder element 37 and the secondary multiplying element 38 for correcting the digital output signal.

Each time the main multiplexer 9 is operated under the control of the control circuit 10 for selecting an input channel CHA1 to CHAN, the appropriate secondary offset and gain registers are selected by the first and second secondary output multiplexers 40 and 41 so that the corresponding secondary offset and gain correction codes corresponding to the selected input channel are read into the computation circuit 71 for in turn computing the first and second calibration code elements from the secondary offset and gain correction codes and the primary offset and gain correction codes, which are then stored in the first and second calibration code registers 73 and 74.

Figure 4:
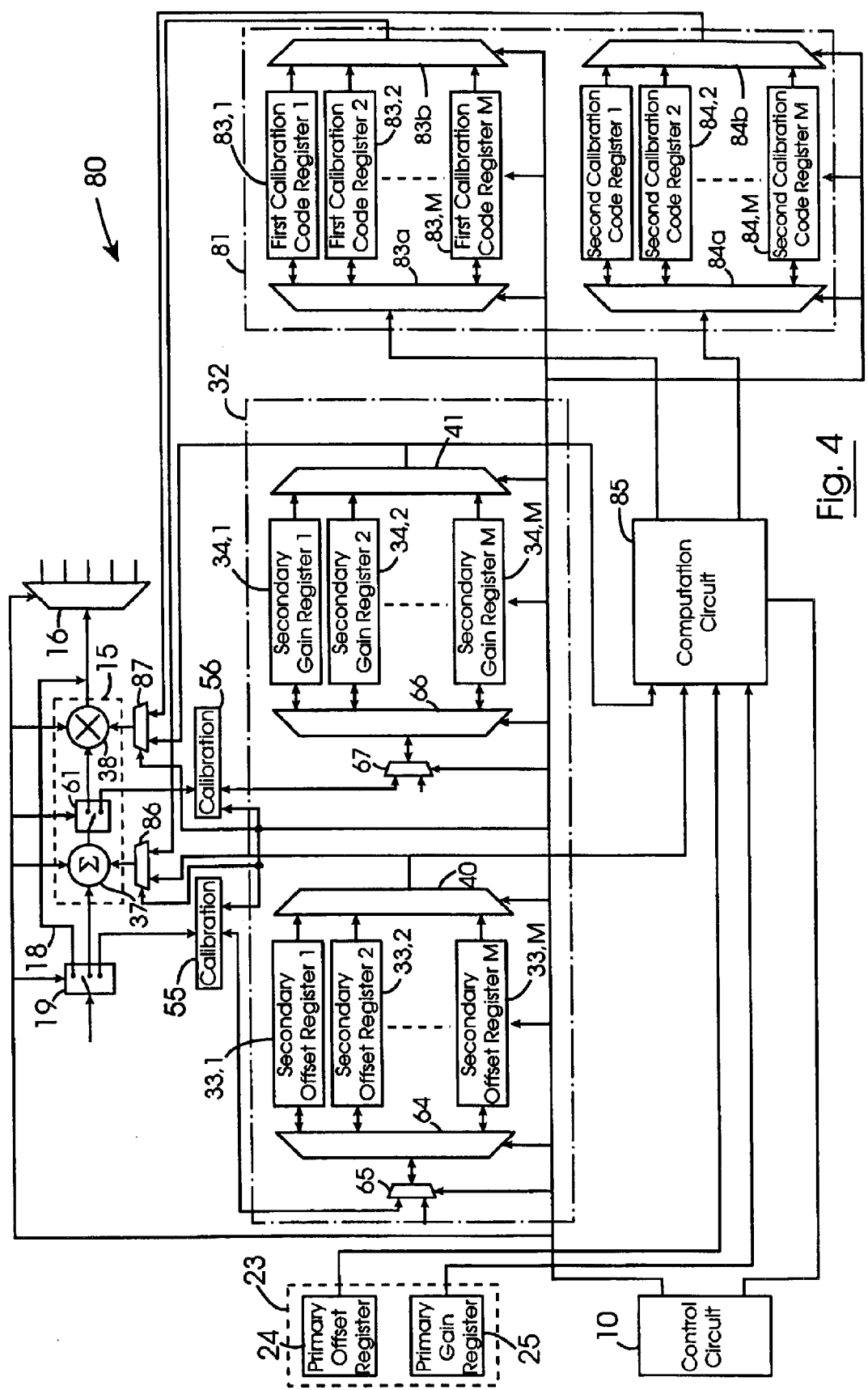
FIG. 4 is a block representation of a portion of an ADC according to another embodiment of the invention.

Referring now to FIG. 4, there is illustrated a portion of a multi-channel ADC according to another embodiment of the invention, indicated generally by the reference numeral 80. The ADC 80 is substantially similar to the ADC 1 and similar components are identified by the same reference numerals. In this embodiment of the invention only the secondary correcting circuit 15 and the secondary storing circuit 32 are illustrated. However, the primary correcting circuit is identical to the primary correcting circuit 14 of the ADC 1, and comprises similar primary offset and gain correction code determining circuits, and similar primary adder and multiplying elements to those described in the ADC 1. A primary storing circuit 23 with primary offset and gain registers 24 and 25, which are similar to those of the ADC 1 are illustrated. The ADC 80 also comprises an interface circuit which is not illustrated, but which is similar to the interface circuit 68, and a control circuit 10, which is illustrated, and which is substantially similar to the control circuit 10 of the ADC 1. However, in this embodiment of the invention as well as the primary and secondary offset and gain storing registers 24 and 25, and 33 and 34, the ADC 80 also comprises a combined calibration coefficient storing circuit 81 for storing combined calibration coefficients for correcting for offset and gain errors introduced by the ADC circuit 2 and the corresponding input channels CHA1 to CHAN.

The combined calibration coefficient storing circuit 81 comprises first and second calibration code registers 83 and 84, respectively. The first calibration code registers 83 store first calibration code elements of the combined calibration coefficients for the corresponding input channels CHA1 to CHAN, while the second calibration code registers 84 store second calibration code elements of the combined calibration coefficients corresponding to the input channels CHA1 to CHAN. The first and second calibration code elements are similar to those described with reference to the ADC 70. The combined calibration coefficient storing circuit 81 comprises M first calibration code registers 83 and M second calibration code registers 84 corresponding to the secondary offset and gain registers 33,1 to 33,M and 34,1 to 34,M, respectively. A computation element, comprising a computation circuit 85, which is substantially similar to the computation circuit 71 of the ADC 70, computes the first and second calibration code elements for the corresponding input channels CHA1 to CHAN and writes the first and second calibration codes into the corresponding first and second calibration code registers 83 and 84. The computation circuit 85 computes the first and second calibration code elements for the respective corresponding input channels CHA1 to CHAN in similar fashion as the computation circuit 71 of the ADC 70 computes the first and second calibration code elements. In this embodiment of the invention after the primary offset and gain correction codes have been stored in the primary offset and gain registers 24 and 25, and the secondary offset and gain correction codes for correcting for input channel errors only have been stored in the corresponding secondary offset and gain registers 33 and 34, the computation circuit 85 computes the first and second calibration code elements corresponding to the respective input channels from the primary offset and gain correction codes stored in the primary offset and gain registers 24 and 25, and from the secondary offset and gain correction codes stored in the secondary offset and gain registers 33 and 34, corresponding to the respective input channels CHA1 to CHAN.

First and second calibration code demultiplexers 83a and 84a under the control of the control circuit 10 select the first and second calibration code registers 83 and 84 to which the first and second calibration code elements are to be written. First and second calibration code multiplexers 83b and 84b under the control of the control circuit 10 select the first and second calibration code registers 83 and 84 from which the first and second calibration code elements are to be read for applying to the corresponding digital output signal.

First and second multiplexers 86 and 87 are provided for selectively switching either selected ones of the secondary offset and gain registers 33 and 34 or selected ones of the first and second calibration code registers 83 and 84 to the secondary adder element 37 and the secondary multiplying element 38, respectively, depending on how the ADC 80 is being operated for correcting the digital output signals for errors introduced by the analog input channels CHA1 to CHAN and the ADC circuit 2.

To compute the first and second calibration code elements for the first input channel CHA1, the computation circuit 85 reads the primary offset and gain correction codes from the primary offset and gain registers 24 and 25, and the computation circuit 85 also reads the secondary offset and gain correction codes for the first input channel CHA1 from the corresponding secondary offset and gain registers 33 and 34. From this the first and second calibration code elements are computed by the computation circuit 85, and written to the first and second calibration code registers 83 and 84, respectively. The first and second calibration codes may be computed in any form, for example, the forms described with reference to the equations (1) to (11) which have been described with reference to the ADC 70 of FIGS. 2 and 3.

Where the ADC 80 is operated to apply the combined calibration codes to the digital output signals, the first and second multiplexers 86 and 87 are operated for selecting the combined calibration coefficient storing circuit 81. The first and second calibration code multiplexers 83b and 84b are operated for selecting the appropriate first and second calibration code registers 83 and 84, corresponding to the digital output signal being corrected. The selected first and second calibration codes corresponding to the digital output signal are applied to the digital output signal in the secondary correcting circuit 15 by the secondary adder element 37 and the secondary multiplying element 38, respectively. When operating in this manner for correcting the digital output signals with the first and second calibration codes, the primary correcting circuit 14 is bypassed.

Otherwise, operation of the ADC 80 is similar to that described with reference to the ADC 1. When the digital output signals are to be corrected with the primary offset and gain correction codes and/or the secondary offset and gain correction codes the first and second multiplexers 86 and 87 are operated for selecting the secondary storing circuit 32, and the first and second switch circuits 12 and 19 are operated for selecting the primary correcting or bypass circuits 14 or 17, and the secondary correcting or bypass circuits 15 or 18, as desired.

The advantage of the ADC 80 according to this embodiment of the invention over the ADC 70 is that once the first and second calibration codes have been computed corresponding to each of the input channels, they are stored in the combined calibration coefficient storing circuit 81, and no further computation is required.

Figure 5:
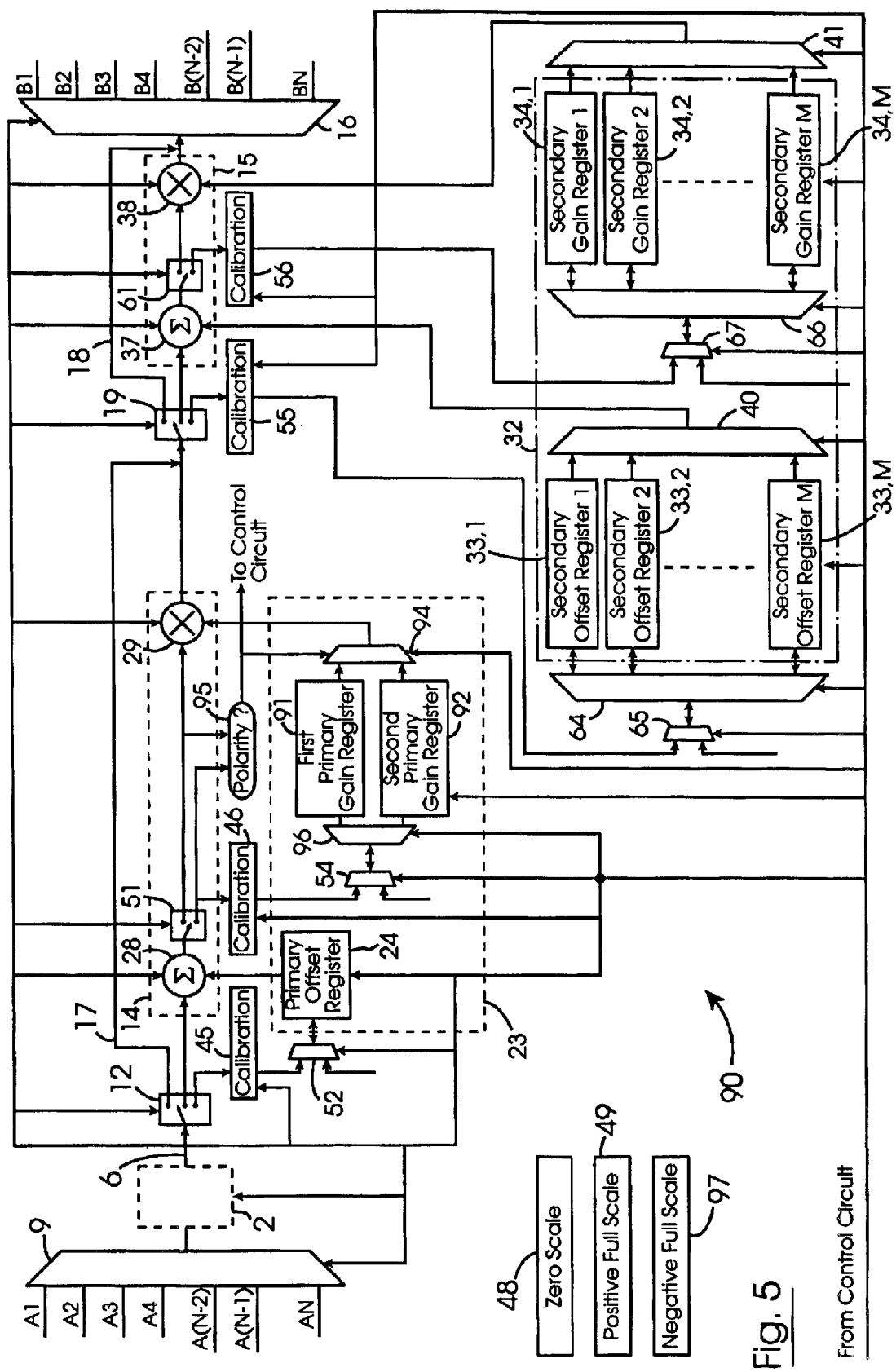
FIG. 5 is a block representation of a portion of a multi-channel ADC according to another embodiment of the invention.

Referring now to FIG. 5, there is illustrated a portion of a multi-channel ADC according to another embodiment of the invention which is indicated generally by the reference numeral 90. The ADC 90 is substantially similar to the ADC 1, and similar components are identified by the same reference numerals. However, only those components which are necessary for an understanding of this embodiment are illustrated, the remaining components have been omitted for convenience. The main difference between the ADC 90 and the ADC 1 is that the primary storing circuit 23 instead of comprising a single primary gain register comprises two primary gain registers, namely, a first primary gain register 91 for storing a first primary gain correction code, and a second primary gain register 92 for storing a second primary gain correction code. The first primary gain correction code is for correcting for gain errors introduced by the ADC circuit 2 to positive digital output signals, and the second primary gain correction code is provided for correcting for gain errors introduced by the ADC circuit 2 to negative digital output signals. It has been found that in certain ADC circuits the primary gain error in positive digital output signals is different to the gain error in negative digital output signals. To overcome this, the first and second primary gain registers 91 and 92 are provided for storing respective first and second primary gain correction codes. The principle of correcting for positive and negative gain errors in an ADC is known from U.S. Pat. No. 5,598,157 of Kornblum et al. A primary gain multiplexer 94 is provided for selectively applying one of the first and second primary gain correction codes from the first and second primary gain registers 91 and 92 to the primary multiplying element 29 in response to a polarity determining circuit 95, and under the control of the control circuit 10. The polarity determining circuit 95 determines the polarity of the digital output signal, the gain of which is to be corrected.

As well as the positive full scale voltage source 49 a negative full scale voltage source 97 is also provided for providing the negative full scale voltage, this may be a separate voltage source, or an inverter for inverting the positive full scale voltage from the positive full scale voltage source 49. The positive full scale voltage is applied to the ADC circuit 2 through the main multiplexer 9 as already described for calibrating the ADC 90 for positive gain errors introduced by the ADC circuit 2. The negative full scale voltage is applied to the ADC circuit 2 in similar fashion for calibrating the ADC 90 for negative gain errors introduced by the ADC circuit 2.

A gain demultiplexer 96 located between the second primary multiplexer 54 and the first and second primary gain registers 91 and 92 selects the appropriate one of the first and second primary gain registers 91 and 92 during calibration. The gain demultiplexer 96 is operated under the control of the control circuit 10. However, before storing each of the first and second primary gain correction codes, the control circuit 10 reads the output of the polarity determining circuit 95 to check the polarity of the digital word resulting from the corresponding one of the positive and negative full scale voltages to ensure that the digital output word is of the correct polarity. The first and second gain correction codes are determined by the primary gain code determining circuit 46 in similar fashion to that already described with reference to the ADC 1, with the exception that the first and second primary gain correction codes are separately determined. To determine the first primary gain correction code, the positive full scale voltage is applied to the ADC circuit 2, and the gain demultiplexer 96 is operated under the control of the control circuit 10 for writing the first primary gain correction code computed by the primary gain code determining circuit 46 to the first primary gain register 91. To determine the second primary gain correction code, the negative full scale voltage is applied to the ADC circuit 2, and the gain demultiplexer 96 is operated under the control of the control circuit 10 for selecting the second primary gain register 92 for writing the second primary gain correction code computed by the primary gain code determining circuit 46 to the second primary gain register 92.

Otherwise, calibration of the ADC 90 is similar to that of the ADC 1.

In use, positive digital output signals are corrected for gain errors introduced by the ADC circuit 2 with the first primary gain correction code, and negative digital output signals are corrected for gain errors introduced by the ADC circuit 2 with the second primary gain correction code.

Figure 6:
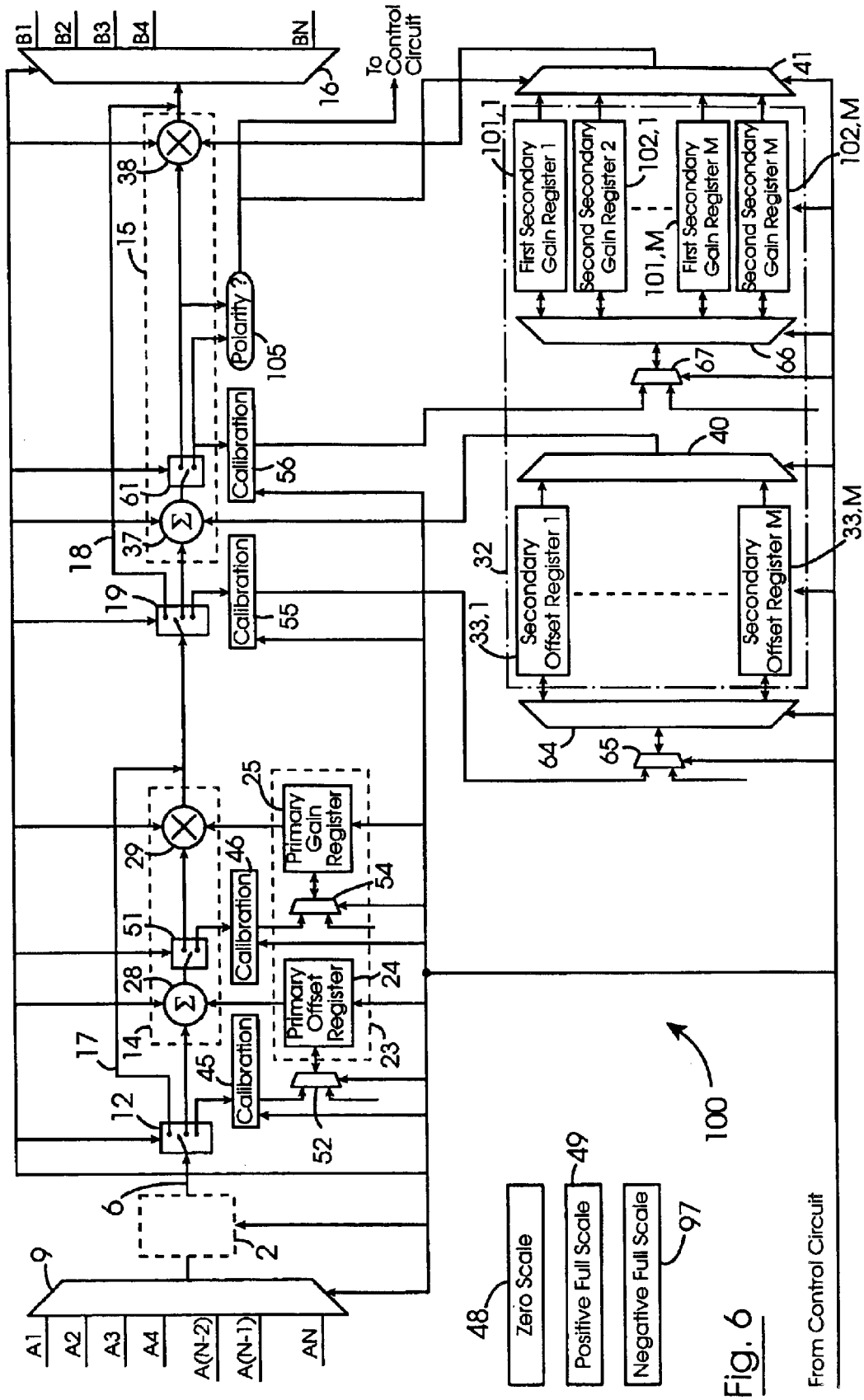
FIG. 6 is a block representation of a portion of a multi-channel ADC according to a further embodiment of the invention.

Referring now to FIG. 6, there is illustrated a portion of a multi-channel ADC 100 according to a still further embodiment of the invention. The ADC 100 is substantially similar to the ADC 1 and similar components are identified by the same reference numerals. However, only those components which are necessary for an understanding of this embodiment are illustrated, the remaining components have been omitted for convenience. The main difference between the ADC 100 and the ADC 1 is that the secondary storing circuit 32 instead of comprising one secondary gain register corresponding to each input channel, comprises two secondary gain registers corresponding to each input channel, namely, a first secondary gain register 101 and a second secondary gain register 102. The first secondary gain registers 101 store first secondary gain correction codes for correcting for errors introduced by the corresponding input channels to positive signals, while the second secondary gain registers 102 store second secondary gain correction codes for correcting for gain errors introduced by the corresponding input channels to negative signals. In this embodiment of the invention the second secondary output multiplexer 41 is responsive to the control circuit 10 and to a polarity determining circuit 105 for selecting the appropriate one of the first and second secondary gain registers 101 and 102 corresponding to the digital output signal, depending on whether the digital output signal is positive or negative. The polarity determining circuit 105 is similar to the polarity determining circuit 95 of the ADC 90.

Calibration of the ADC 100 for calibrating for positive and negative gain errors in the input channels CHA1 to CHAN is substantially similar to the calibration method already described with reference to the ADC 90 for calibrating for positive and negative gain errors introduced by the ADC circuit 2. However, in the ADC 100, the calibration is carried out with respect to the secondary correcting circuit 15 and the secondary storing circuit 32. For example, to calibrate for the first input channel CHA1 after the secondary offset correction code has been determined and stored in the secondary offset register 33 corresponding to the first input channel CHA1, the positive full scale voltage or an appropriate positive full scale signal is applied to the first input channel CHA1. The main multiplexer 9 is switched for applying the positive full scale voltage or the appropriate positive full scale signal to the ADC circuit 2, and the digital output word from the ADC circuit 2 is applied by the first switch circuit 12 to the primary correcting circuit 14 where it is corrected for ADC circuit errors by the primary offset and gain correction codes. The corrected digital output word from the primary correcting circuit 14 is switched by the second switch circuit 19 to the secondary correcting circuit 15 where the just stored secondary offset correction code is applied to the digital output word by the secondary adder element 37. The digital output word so corrected is switched by the second secondary calibrating switch 61 to the secondary gain correction code determining circuit 56 where the first secondary gain correction code is determined. The second secondary demultiplexer 66 is operated under the control of the control circuit 10 for selecting the first secondary gain register 101 corresponding to the first input channel CHA1, and the determined first secondary gain correction code is written to the selected first secondary gain register 101. The negative full scale voltage or an appropriate negative full scale signal is then applied to the first input channel CHA1 for determining the second secondary gain correction code in similar fashion. When the second secondary gain correction code has been determined by the secondary gain correction code determining circuit 56, the second secondary demultiplexer 66 is operated under the control of the control circuit 10 for selecting the second secondary gain register 102 corresponding to the first input channel CHA1, and the determined second secondary correction code is written to the selected second secondary gain register 102.

Otherwise, calibration and operation of the ADC 100 is similar to that of the ADC 1 described with reference to FIG. 1. Positive digital output signals are corrected for gain errors by the first secondary gain correction codes stored in the first secondary gain registers 101, and negative digital output signals are corrected for gain errors by the second secondary gain correction codes stored in the corresponding second secondary gain registers 102.

Figure 7:
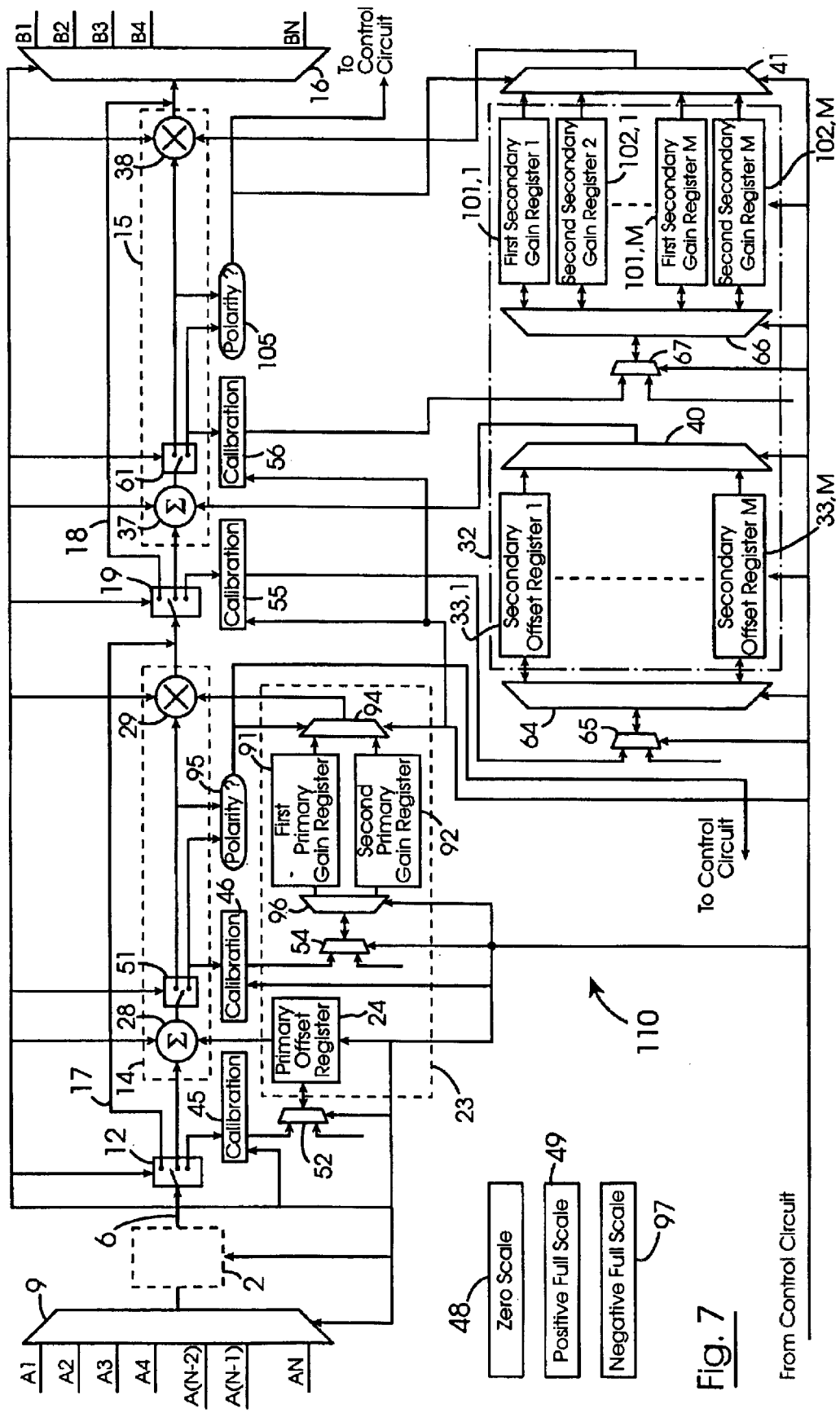
FIG. 7 is a block representation of a portion of a multi-channel ADC according to a still further embodiment of the invention.

Referring now to FIG. 7, there is illustrated a block representation of a portion of a multi-channel ADC according to a further embodiment of the invention, indicated generally by the reference numeral 110. The ADC 110 is substantially similar to the ADC 1, and similar components are identified by the same reference numerals. However, only those components which are necessary for an understanding of this embodiment are illustrated, the remaining components have been omitted for convenience. In this embodiment of the invention the ADC 110 comprises first and second primary gain registers 91 and 92, respectively, which are similar to those of the ADC 90, and the secondary storing circuit 32 of the ADC 110 also comprises first and second secondary gain registers 101 and 102 which are similar to those of the ADC 100. Accordingly, calibration and use of the ADC 110 is substantially similar to that described with reference to the ADC 1 and the ADC 90 and 100, and will readily be apparent to those skilled in the art.

Figure 8:
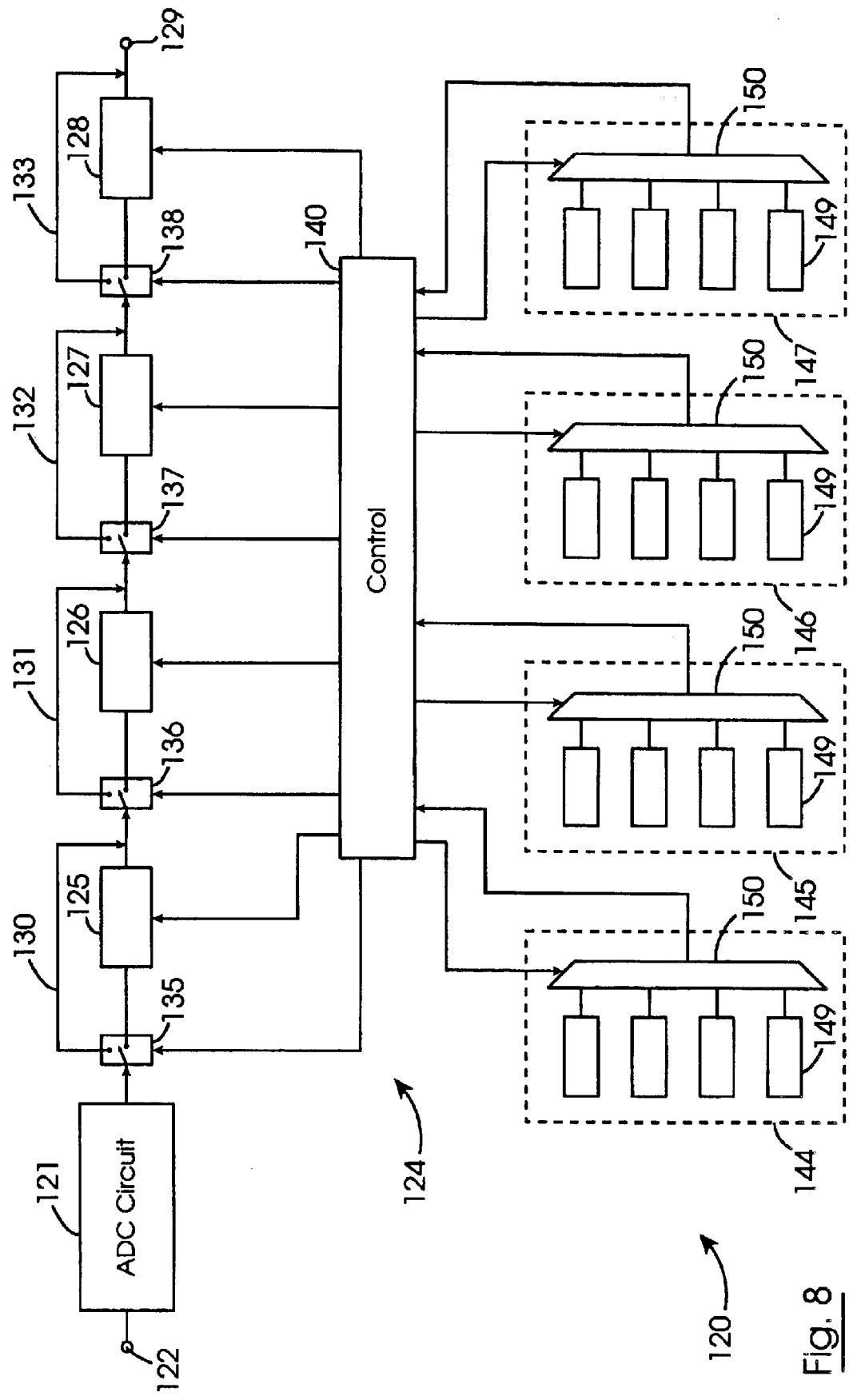
FIG. 8 is a block representation of an ADC according to a further embodiment of the invention.

Referring to FIG. 8 there is illustrated an ADC 120 according to another embodiment of the invention. The ADC is implement as an integrated circuit, and may be a single channel ADC, or a multi-channel ADC of the type described with reference to FIG. 1. The ADC 120 comprises an ADC circuit 121 for converting analog input signals received on an analog input terminal 122, which if the ADC is a multi-channel ADC would be received from a multiplexer, for example, similar to the main multiplexer 9 of the ADC 1 of FIG. 1, which may be provided on-chip or off-chip. Digital output signals converted from the analog signals received on the input terminal 122 are outputted by the ADC circuit 121 to a correcting circuit 124, and in turn to a digital output port 129. The correcting circuit 124 in this embodiment of the invention comprises four stages, namely, a first correction stage 125, a second correction stage 126, a third correction stage 127 and a fourth correction stage 128 for selectively and sequentially applying calibration coefficients as will be described below to the digital output signals. Four bypass circuits, namely, first, second, third and fourth bypass circuits 130, 131, 132 and 133, respectively, are provided for selectively bypassing the first, second, third and fourth correction stages 125, 126, 127 and 128, respectively. A first switch 135 is provided for selecting either the first correction stage 125 or the first bypass circuit 130 for passing the digital output signals therethrough. A second switch 136 is provided for selecting either the second correction stage 126 or the second bypass circuit 131 for passing the digital output signals therethrough. Third and fourth switches 137 and 138 are provided for selecting the corresponding one of the third and fourth correction stages 127 and 128 or the third and fourth bypass circuits 132 and 133 for passing the digital output signals therethrough. The first, second, third and fourth switches 135, 136, 137 and 138 operate under the control of a control circuit 140.

A plurality of calibration coefficient storing circuits, in this embodiment of the invention four calibration coefficient storing circuits 144, 145, 146 and 147 are provided for storing calibration coefficients for correcting the digital output signals for errors introduced by the ADC circuit 121, and/or if the ADC 120 is a multi-channel ADC for correcting for errors introduced by the analog input channels. Each calibration coefficient storing circuit 144, 145, 146 and 147 comprises a plurality of calibration coefficient registers 149 for storing selectable calibration coefficients for correcting for various errors introduced by the ADC circuit 121 and/or input channel errors. Each calibration coefficient storing circuit 144, 145, 146 and 147 comprises a calibration switch network, namely, a calibration coefficient multiplexer 150 which under the control of the control circuit 140 selects the appropriate calibration coefficient register 149 from the corresponding calibration coefficient storing circuits 144, 145, 146 and 147 for applying to the corresponding digital output signal.

Each of the first, second, third and fourth correction stages 125, 126, 127 and 128 of the correcting circuit 124 comprises an adder element (not shown) and a multiplying element (also not shown) similar to the adder and multiplying elements of the ADC 1 for applying the calibration coefficients to the corresponding digital output signals. The calibration coefficients typically are stored in the calibration coefficient registers 149 as offset and gain codes as described with reference to the ADC 1 of FIG. 1. However, while each calibration coefficient in this embodiment of the invention is described as being stored in a calibration coefficient register 149, each calibration coefficient register 149 would include the appropriate number of registers for storing offset and gain correction codes, and such registers would be selectable by the calibration coefficient multiplexers 150 or by additional multiplexers as required. This will be clear to those skilled in the art from the description of the earlier embodiments of the invention which have been described with reference to FIGS. 1 to 7. Additionally, a calibration coefficient determining circuit or circuits are provided but not illustrated, for determining the calibration coefficients. Such calibration coefficient determining circuit or circuits may be similar to those described with reference to the ADCs of FIGS. 1 to 7.

In this embodiment of the invention, the ADC 120 is operable under the control of the control circuit 140 for selectively applying the calibration coefficients from the first, second, third and fourth calibration coefficient storing circuits 144, 145, 146 and 147 to the digital output signals in any desired sequence. For example, while a calibration coefficient or coefficients stored in the first calibration coefficient storing circuit 144 may be applied to a digital output signal in the first correction stage 125, under the control of the control circuit 140 the calibration coefficient or coefficients stored in the first calibration coefficient storing circuit 144 could be applied under the control of the control circuit 140 to the digital output signal in any of the first, second, third and fourth correcting stages 125, 126, 127 or 128. Additionally, under the control of the control circuit 140 the digital output signals may be passed directly from the ADC circuit 121 to the output port 129 through the four bypass circuits 130, 131, 132 and 133. Alternatively, the digital output signals may be selectively passed through one or more or all of the correction stages 125, 126, 127 and 128, depending on the number of stages of correction of the digital output signal are to be carried out. The first, second, third and fourth switches 135 to 138 are operated under the control of the control circuit 140 for selecting the correction stages 125 to 128 through which each digital output signal is to be passed.

The advantage of the ADC 120 according to this embodiment of the invention is that the ADC output signals may be selectively corrected for different errors introduced by the ADC circuit 121, and the respective corrections are carried out in an suitable desired sequence. Additionally, as mentioned above, if the ADC 120 is a multi-channel ADC, some of the calibration coefficient storing circuits 144, 145, 146 and 147 may store calibration coefficients for correcting for errors in the input channels only or for correcting for combined errors in the input channels and the ADC.

While the ADC 120 has been described as comprising a correcting circuit comprising four correction stages, it will be readily apparent to those skilled in the art that the correcting circuit may comprise any number of correcting stages, depending on the maximum number of corrections to the digital output signals to be made. Additionally, while four calibration coefficient storing circuits have been described, any number of calibration coefficient storing circuits may be provided, and it will be readily apparent to those skilled in the art that the number of calibration coefficient storing circuits may be greater or less than the number of correction stages in the correcting circuit, and in many cases the number of calibration coefficient storing circuits will be greater than the number of correction stages in the correcting circuit.

It will also of course be appreciated that any of the calibration coefficients described with reference to the ADCs of FIGS. 1 to 7 may be stored in the calibration coefficient storing circuits of the ADC 120.

Needless to say, any combination of the calibration methods described may be carried out. For example, in the case of some of the input channels the corresponding offset and gain correction codes could be determined using the secondary offset and gain code determining circuits, and then written to the corresponding secondary offset and gain registers, and for others of the input channels the respective offset and gain correction codes would be entered manually into the corresponding secondary offset and gain registers.

Similarly, during normal operation of the ADCs for converting analog signals on the respective input channels to digital output signals, the ADCs could be operated for correcting for offset and gain errors introduced by the ADC circuit only for some of the channels, and for correcting for offset and gain errors introduced by others of the channels only, and in other cases, the ADC could be operated for carrying out no correction for errors introduced by either the ADC circuit and some of the input channels. In which cases, the first and second switch circuits 12 and 19 would be appropriately operated for selecting the primary and secondary bypass circuits 17 and 18, respectively.

It will also be appreciated that when the ADC 1 is operated with the primary codes stored in the secondary registers, only the secondary correcting circuit is required. Thus, in this case, the first and second switch circuits 12 and 19 are operated for selecting the primary bypass circuit 17 and the secondary correcting circuit 15. In this case, some of the primary offset and gain codes in the secondary offset and gain registers may be overwritten with secondary offset and gain codes which would include correction for errors introduced by both the input channels and the ADC circuit.

While the ADCs have been described as comprising N input channels and N output channels, the number of output channels may be greater or less than the number of input channels, and it will also of course be appreciated that the number of secondary offset and gain registers may be different to the number of input channels. For example, in certain cases, it is envisaged that secondary offset and gain registers may not be provided for alt the input channels.

It is also envisaged that in the ADC 70 the first and second calibration code registers 73 and 74 may be omitted, and in which case, the computed first and second calibration code elements would be read directly from the computation circuit 71 to the secondary adder element 37 and the secondary multiplying element 38, respectively.

It is also envisaged that as well as the primary and secondary correction circuits, other correction circuits may be provided in parallel or in series with the primary and secondary correcting circuits for correcting for other aspects of the ADCs.

While in the ADCs described with reference to FIGS. 2 to 4 the combined calibration coefficients have been described as comprising first and second calibration code elements, in certain cases, it is envisaged that each combined calibration coefficient may be provided as a single calibration code element, which would be applied to the corresponding digital output signal by an appropriate element, which would typically be located in the secondary correcting circuit.

While the zero scale, positive full scale and negative full scale voltages have been described as being applied to the ADC circuit 2 for calibration thereof through the main multiplexer, it is envisaged in certain cases that the zero scale, positive full scale and negative full scale voltages may be applied directly to the ADC circuit 2, between the main multiplexer and the ADC circuit 2.

In the ADCs described with reference to FIGS. 5 to 7, the multiplexers which are operated under the control of the control circuit 10 and the polarity determined circuit may be operated under the control of the control circuit 10 only for applying the appropriate one of the first and second gain correction codes. In which case, the control circuit 10 would read the output of the polarity determining circuit, and would then operate the corresponding multiplexer to switch the appropriate one of the first or second gain correction codes to the corresponding multiplying element.

While in the embodiments of the ADCs described with reference to FIGS. 1 to 7, the main multiplexer 9 and the main demultiplexer 16 have been described as being on-chip, the main multiplexer 9 and the main demultiplexer 16 may be provided off-chip. Additionally, it is envisaged that in such cases the control circuit may also be provided off-chip, or at least part thereof, particularly in connection with the ADCs described with reference to FIGS. 1 to 7.

What is claimed is:

1. A multi-channel analog to digital converter (ADC) comprising:
   an ADC circuit for sequentially converting analog input signals received from a plurality of input channels to digital output signals,
   a primary storing circuit for storing a primary calibration coefficient for correcting the digital output signals for errors introduced by the ADC circuit, a secondary storing circuit for storing secondary calibration coefficients corresponding to respective ones of the input channels for correcting the digital output signals for errors introduced by the respective corresponding input channels.

2. An ADC as claimed in claim 1 in which a correcting circuit is provided for selectively applying to at least some of the digital output signals, at least one of the primary calibration coefficient and the corresponding secondary calibration coefficient.

3. An ADC as claimed in claim 2 in which a primary calibration coefficient determining circuit is provided for determining the primary calibration coefficient for writing to the primary storing circuit, and a secondary calibration coefficient determining circuit is provided for determining the secondary calibration coefficients for the respective input channels for writing to the secondary storing circuit.

4. An ADC as claimed in claim 3 in which the correcting circuit comprises a primary correcting circuit for applying the primary calibration coefficient stored in the primary storing circuit to the at least some of the digital output signals for correcting the digital output signals with the primary calibration coefficient, and a secondary correcting circuit for selectively applying corresponding ones of the secondary calibration coefficients stored in the secondary storing circuit to the corresponding digital output signals for correcting the at least some of the digital output signals.

5. An ADC as claimed in claim 4 in which the primary and secondary correcting circuits are arranged relative to the ADC circuit for applying the primary calibration coefficient to the digital output signals prior to the corresponding secondary calibration coefficients being applied to the respective corresponding digital output signals.

6. An ADC as claimed in claim 4 in which the primary storing circuit comprises a primary offset register for storing a primary offset correction code for correcting for offset errors introduced by the ADC circuit, and a primary gain register for storing a primary gain correction code for correcting for gain errors introduced by the ADC circuit.

7. An ADC as claimed in claim 6 in which the primary calibration coefficient determining circuit comprises a primary offset code determining circuit for determining the primary offset correction code for storing in the primary offset register, and a primary gain code determining circuit for determining the primary gain correction code for storing in the primary gain register.

8. An ADC as claimed in claim 4 in which the secondary storing circuit comprises a plurality of secondary offset registers for storing respective secondary offset correction codes corresponding to respective ones of the input channels for correcting for offset errors introduced by the respective corresponding input channels, and a plurality of secondary gain registers for storing respective secondary gain correction codes corresponding to respective ones of the input channels for correcting for gain errors introduced by the respective corresponding input channels.

9. An ADC as claimed in claim 6 in which the secondary calibration coefficient determining circuit comprises a secondary offset code determining circuit for determining the secondary offset correction codes for the respective input channels for storing in the corresponding secondary offset registers, and a secondary gain code determining circuit for determining the secondary gain correction codes for the respective input channels for storing in the corresponding secondary gain registers.

10. An ADC as claimed in claim 9 in which the secondary offset code determining circuit is operable for determining the secondary offset correction codes for correcting for offset errors introduced by the respective input channels.

11. An ADC as claimed in claim 9 in which the secondary offset code determining circuit is operable for determining the secondary offset correction codes for correcting for combined offset errors introduced by the respective input channels and the ADC circuit.

12. An ADC as claimed in claim 9 in which the secondary gain code determining circuit is operable for determining the secondary gain correction codes for correcting for gain errors introduced by the respective input channels.

13. An ADC as claimed in claim 9 in which the secondary gain code determining circuit is operable for determining the secondary gain correction codes for correcting for combined gain errors introduced by the respective input channels and the ADC circuit.

14. An ADC as claimed in claim 6 in which the primary correcting circuit comprises a primary adder element for applying the primary offset correction code stored in the primary offset register to the digital output signals, and a primary multiplying element for applying the primary gain correction code stored in the primary gain register to the digital output signals.

15. An ADC as claimed in claim 14 in which the primary adder element and the primary multiplying element are arranged so that the primary offset correction code is applied to the respective digital output signals before the primary gain correction code is applied to the digital output signals.

16. An ADC as claimed in claim 8 in which the secondary correcting circuit comprises a secondary adder element for applying the secondary offset correction codes stored in the secondary offset registers to the corresponding ones of the digital output signals, and a secondary multiplying element for applying the secondary gain correction codes stored in the secondary gain registers to the corresponding ones of the digital output signals.

17. An ADC as claimed in claim 16 in which the secondary adder element and the secondary multiplying element are arranged so that the corresponding secondary offset correction code is applied to the corresponding digital output signal before the corresponding secondary gain correction code is applied to the digital output signal.

18. An ADC as claimed in claim 4 in which a bypass circuit is provided so that one or both of the primary correcting circuit and the secondary correcting circuit can be selectively bypassed.

19. An ADC as claimed in claim 2 in which a computation element is provided for computing combined calibration coefficients for correcting for errors introduced by the ADC circuit and respective ones of the input channels, the computation element computing the combined calibration coefficients from the primary calibration coefficient stored in the primary storing circuit, and the corresponding secondary calibration coefficients stored in the secondary storing circuit.

20. An ADC as claimed in claim 19 in which the correcting circuit comprises a means for applying the combined calibration coefficients to the corresponding digital output signals.

21. An ADC as claimed in claim 19 in which each combined calibration coefficient comprises a first calibration code element to be applied to the corresponding digital output signal, and a second calibration code element to be applied to the corresponding digital output signal.

22. An ADC as claimed in claim 20 in which the correcting circuit comprises a first adder element for applying the first calibration code elements to the corresponding digital output signals, and a multiplying element for applying the second calibration code element to the corresponding digital output signals.

23. An ADC as claimed in claim 19 in which a combined calibration coefficient storing circuit is provided for storing the respective computed combined calibration coefficients.

24. An ADC as claimed in claim 6 in which the primary gain register comprises a first primary gain register for storing a first primary gain correction code of the primary gain correction code for applying to the digital output signals which are of value greater than a predetermined value, and a second primary gain register for storing a second primary gain correction code of the primary gain correction code for applying to the digital output signal which are of value less than the predetermined value.

25. An ADC as claimed in claim 8 in which each secondary gain register comprises a first secondary gain register for storing a first secondary gain correction code of the corresponding secondary gain correction code for applying to the corresponding digital output signal which is of value greater than a predetermined value, and a second secondary gain register for storing a second secondary gain correction code of the corresponding secondary gain correction code for applying to the corresponding digital output signal which is of value less than the predetermined value.

26. An ADC as claimed in claim 8 in which an interface circuit is provided for facilitating selective manual inputting of secondary offset and gain correction codes to respective selected ones of the secondary offset and gain registers.

27. An ADC as claimed in claim 26 in which the interface circuit facilitates selective manual inputting of primary offset and gain correction codes to the primary offset and gain registers.

28. An ADC as claimed in claim 26 in which the interface circuit is adapted for facilitating selective manual outputting of secondary offset and gain correction codes from the secondary offset and gain registers.

29. An ADC as claimed in claim 26 in which the interface circuit facilitates selective manual outputting of the primary offset and gain correction codes from the primary offset and gain registers.

30. An ADC as claimed in claim 1 in which a first calibration reference signal source is provided for applying to the ADC circuit for determining the primary calibration coefficient.

31. An ADC as claimed in claim 30 in which the first calibration reference signal source is selectively applicable to the respective input channels for determining the corresponding secondary calibration coefficients.

32. An ADC as claimed in claim 1 in which a second high calibration reference signal source is provided for applying to the ADC circuit for determining the primary calibration coefficient.

33. An ADC as claimed in claim 32 in which the second high calibration reference signal source is selectively applicable to the respective input channels for determining the corresponding secondary calibration coefficients.

34. An ADC as claimed in claim 1 in which a second low calibration reference signal source is provided for applying to the ADC circuit for determining the primary calibration coefficient.

35. An ADC as claimed in claim 34 in which the second high calibration reference signal source is selectively applicable to the respective input channels for determining the corresponding secondary calibration coefficients.

36. An ADC as claimed in claim 1 in which the ADC further comprises a plurality of input terminals for receiving the analog input signals from the input channels, a main switch network for selectively and sequentially switching the input terminals to the ADC circuit, and a control circuit for controlling the main switch network for determining the sequence in which the input terminals are to be switched to the ADC circuit.

37. An ADC comprising:
an ADC circuit for converting an analog input signal to a digital output signal,
a plurality of storing circuits for storing calibration coefficients for correcting for errors introduced by the ADC circuit,
a correcting circuit comprising a plurality of correction stages in which calibration coefficients from the storing circuits are applied to the digital output signal as the digital output signal is passed therethrough, the correction stages through which the digital output signal is passed being selectable.

38. An ADC as claimed in claim 37 in which the calibration coefficients to be applied to the digital output signal are selectable.

39. An ADC as claimed in claim 37 in which the sequence in which the calibration coefficients are applied to the digital output signal is selectable.

40. A method for calibrating a multi-channel ADC comprising an ADC circuit for receiving analog input signals from a plurality of input channels, the method comprising the steps of:
determining a primary calibration coefficient for correcting digital output signals for errors introduced by the ADC circuit,
storing the primary calibration coefficient so that the primary calibration coefficient can be selectively applied to digital output signals from the ADC circuit for correcting for errors in the digital output signals introduced by the ADC circuit,
determining secondary calibration coefficients for at least some of the input channels for correcting for errors introduced by the corresponding input channels,
storing the secondary calibration coefficients so that the secondary calibration coefficients can be selectively applied to digital output signals resulting from analog input signals for correcting for errors introduced by the corresponding input channels.

41. A method as claimed in claim 40 in which a calibration reference signal is applied to the ADC circuit for determining the primary calibration coefficient.

42. A method as claimed in claim 40 in which a calibration reference signal is sequentially applied to the at least some of the input channels for determining the corresponding secondary calibration coefficients.

43. A method as claimed in claim 41 in which the digital output signal from the ADC circuit resulting from the calibration reference signal applied to the ADC circuit is compared with an ideal value for determining the primary calibration coefficient.

44. A method as claimed in claim 42 in which the digital output signals from the ADC circuit resulting from the calibration reference signal applied to input channels are compared with respective ideal values for determining the secondary calibration coefficients for the respective corresponding input channels.

45. A method as claimed in claim 42 in which the primary calibration coefficient is applied to each digital output signal from the ADC circuit resulting from the calibration reference signal applied to a corresponding one of the input channels prior to the secondary calibration coefficient being determined so that the determined secondary calibration coefficient corrects for errors introduced only by the corresponding input channel.

46. A method as claimed in claim 42 in which the primary and secondary calibration coefficients are stored so that each digital output signal resulting from a conversion by the ADC circuit is corrected separately by the primary calibration coefficient and the corresponding one of the secondary calibration coefficients.

47. A method as claimed in claim 42 in which the method comprises the further step of computing a combined calibration coefficient corresponding to each input channel for which a secondary calibration coefficient has been determined for correcting for errors introduced by the ADC circuit and the corresponding input channel, each combined calibration coefficient being determined from the primary calibration coefficient and the corresponding secondary calibration coefficient.

48. A method as claimed in claim 42 in which a first high calibration reference signal is applied to the ADC circuit for determining a first primary calibration coefficient of the primary calibration coefficient for applying to the digital output signals which are of value greater than a predetermined value, and a second low calibration reference signal is applied to the ADC circuit for determining a second primary calibration coefficient of the primary calibration coefficient for applying to the digital output signals.

49. A method for correcting a digital output signal converted from an analog input signal by an ADC for errors introduced by the ADC, the method comprising the steps of:
   storing a plurality of calibration coefficients for correcting for errors introduced by the ADC in storing circuits,
   passing the digital output signal through a correcting circuit comprising a plurality of correction stages,
   selecting at least one of the correction stages of the correcting circuit through which the digital output signal is to be passed, and
   applying calibration coefficients from the storing circuits to the digital output signal in the selected correction stages.

50. A method as claimed in claim 49 in which the method further comprises selecting the sequence in which the calibration coefficients are applied to the digital output signal.

51. A method as claimed in claim 49 in which the method further comprises selecting the sequence in which the calibration coefficients are applied to the digital output signal.

52. A method for calibrating a multi-channel ADC comprising an ADC circuit, and a plurality of input terminals for receiving analog input signals from corresponding input channels, the input terminals being sequentially switchable to the ADC circuit, the method comprising the steps of:
   applying a calibration reference signal to the ADC circuit for determining a primary calibration coefficient for errors introduced by the ADC circuit,
   determining the primary calibration coefficient,
   storing the primary calibration coefficient in a plurality of calibration coefficient registers corresponding to at least some of the respective input channels so that the primary calibration coefficients stored in the respective calibration coefficient registers can be selectively applied to the digital output signals from the ADC circuit resulting from analog input signals on the corresponding input channels for correcting for errors introduced by the ADC circuit,
   determining secondary calibration coefficients for at least some of the corresponding input channels for which corresponding calibration coefficient registers have been provided, and storing the secondary calibration coefficients in the corresponding calibration coefficient registers by overwriting the primary calibration coefficient already stored in the corresponding calibration coefficient register.

* * * * *